United States Patent
Raring et al.

(10) Patent No.: US 9,071,039 B2
(45) Date of Patent: *Jun. 30, 2015

(54) OPTICAL DEVICE STRUCTURE USING GAN SUBSTRATES FOR LASER APPLICATIONS

(71) Applicant: Soraa Laser Diode, Inc., Goleta, CA (US)

(72) Inventors: James W. Raring, Goleta, CA (US); Daniel F. Feezell, Goleta, CA (US); Nicholas J. Pfister, Goleta, CA (US); Rajat Sharma, Goleta, CA (US); Mathew C. Schmidt, Goleta, CA (US); Christiane Poblenz Elsass, Goleta, CA (US); Yu-Chia Chang, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/134,244

(22) Filed: Dec. 19, 2013

(65) Prior Publication Data

US 2014/0295595 A1 Oct. 2, 2014

Related U.S. Application Data

(63) Continuation of application No. 12/868,441, filed on Aug. 25, 2010, now Pat. No. 8,634,442, which is a continuation-in-part of application No. 12/759,273, filed on Apr. 13, 2010.

(60) Provisional application No. 61/168,926, filed on Apr. 13, 2009, provisional application No. 61/243,502, filed on Sep. 17, 2009.

(51) Int. Cl.
*H01S 5/00* (2006.01)
*H01S 5/22* (2006.01)
(Continued)

(52) U.S. Cl.
CPC ......... *H01S 5/2201* (2013.01); *H01L 21/02389* (2013.01); *H01L 21/02433* (2013.01);
(Continued)

(58) Field of Classification Search
CPC ... H01S 5/2201; H01S 5/3202; H01S 5/0287; H01S 5/34333; H01S 5/028; H01S 5/2009; H01S 5/0202; H01L 21/02389; H01L 21/02433; H01L 21/0254
USPC ............ 372/43.01–50.23; 438/767–769, 604, 438/606, 7

See application file for complete search history.

(56) References Cited

U.S. PATENT DOCUMENTS

| 4,318,058 A | 3/1982 | Mito et al. |
| 4,341,592 A | 7/1982 | Shortes et al. |

(Continued)

FOREIGN PATENT DOCUMENTS

| CN | 101009347 | 3/1987 |
| CN | 1538534 | 10/2004 |

(Continued)

OTHER PUBLICATIONS

Notice of Allowance of Mar. 20, 2014 for U.S. Appl. No. 13/549,335, 19 pages.

(Continued)

*Primary Examiner* — Colleen A Matthews
*Assistant Examiner* — Delma R Forde
(74) *Attorney, Agent, or Firm* — Kilpatrick Townsend & Stockton LLP

(57) ABSTRACT

An optical device includes a gallium nitride substrate member having an m-plane nonpolar crystalline surface region characterized by an orientation of about −1 degree towards (000-1) and less than about +/−0.3 degrees towards (11-20). The device also has a laser stripe region formed overlying a portion of the m-plane nonpolar crystalline orientation surface region. In a preferred embodiment, the laser stripe region is characterized by a cavity orientation that is substantially parallel to the c-direction, the laser stripe region having a first end and a second end. The device includes a first cleaved c-face facet, which is coated, provided on the first end of the laser stripe region. The device also has a second cleaved c-face facet, which is exposed, provided on the second end of the laser stripe region.

8 Claims, 17 Drawing Sheets

(51) Int. Cl.
*H01S 5/02* (2006.01)
*H01S 5/343* (2006.01)
*B82Y 20/00* (2011.01)
*H01L 21/02* (2006.01)
*H01S 5/028* (2006.01)
*H01S 5/20* (2006.01)
*H01S 5/32* (2006.01)

(52) U.S. Cl.
CPC .......... *H01L21/0254* (2013.01); *H01S 5/0202* (2013.01); *H01S 5/028* (2013.01); *H01S 5/0287* (2013.01); *H01S 5/2009* (2013.01); *H01S 5/3202* (2013.01); *H01S 5/34333* (2013.01); *B82Y 20/00* (2013.01)

(56) References Cited

U.S. PATENT DOCUMENTS

| | | | |
|---|---|---|---|
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,926,493 A | 7/1999 | O'Brien et al. | |
| 5,951,923 A | 9/1999 | Rorie et al. | |
| 6,069,394 A | 5/2000 | Hashimoto et al. | |
| 6,072,197 A | 6/2000 | Horino et al. | |
| 6,147,953 A | 11/2000 | Duncan | |
| 6,153,010 A | 11/2000 | Kiyoku et al. | |
| 6,195,381 B1 | 2/2001 | Botez et al. | |
| 6,239,454 B1 | 5/2001 | Glew et al. | |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,586,762 B2 | 7/2003 | Kozaki | |
| 6,635,904 B2 | 10/2003 | Goetz et al. | |
| 6,639,925 B2 | 10/2003 | Niwa et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,858,882 B2 | 2/2005 | Tsuda et al. | |
| 6,920,166 B2 | 7/2005 | Akasaka et al. | |
| 7,009,199 B2 | 3/2006 | Hall | |
| 7,019,325 B2 | 3/2006 | Li et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,598,104 B2 | 10/2009 | Teng et al. | |
| 7,691,658 B2 | 4/2010 | Kaeding et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 7,976,630 B2 | 7/2011 | Poblenz et al. | |
| 8,017,932 B2 | 9/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring et al. | |
| 8,143,148 B1 | 3/2012 | Raring et al. | |
| 8,242,522 B1 | 8/2012 | Raring et al. | |
| 8,247,887 B1 | 8/2012 | Raring et al. | |
| 8,254,425 B1 | 8/2012 | Raring et al. | |
| 8,259,769 B1 | 9/2012 | Raring et al. | |
| 8,284,810 B1 | 10/2012 | Sharma et al. | |
| 8,294,179 B1 | 10/2012 | Raring et al. | |
| 8,314,429 B1 | 11/2012 | Raring et al. | |
| 8,350,273 B2 | 1/2013 | Vielemeyer | |
| 8,351,478 B2 | 1/2013 | Raring | |
| 8,355,418 B2 | 1/2013 | Raring et al. | |
| 8,416,825 B1 | 4/2013 | Raring et al. | |
| 8,422,525 B1 | 4/2013 | Raring et al. | |
| 8,427,590 B2 | 4/2013 | Raring et al. | |
| 8,451,876 B1 | 5/2013 | Raring et al. | |
| 8,634,442 B1 * | 1/2014 | Raring et al. | 372/44.01 |
| 8,837,545 B2 | 9/2014 | Raring | |
| 2001/0048114 A1 | 12/2001 | Morita et al. | |
| 2002/0027933 A1 | 3/2002 | Tanabe et al. | |
| 2002/0050488 A1 | 5/2002 | Nikitin et al. | |
| 2002/0085603 A1 | 7/2002 | Okumura | |
| 2002/0105986 A1 | 8/2002 | Yamasaki | |
| 2002/0171092 A1 | 11/2002 | Goetz et al. | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0129810 A1 | 7/2003 | Barth | |
| 2003/0140846 A1 | 7/2003 | Biwa et al. | |
| 2003/0178617 A1 | 9/2003 | Appenzeller et al. | |
| 2003/0200931 A1 | 10/2003 | Goodwin | |
| 2003/0216011 A1 | 11/2003 | Nakamura et al. | |
| 2004/0025787 A1 | 2/2004 | Selbrede et al. | |
| 2004/0060518 A1 | 4/2004 | Nakamura et al. | |
| 2004/0099213 A1 | 5/2004 | Adomaitis et al. | |
| 2004/0104391 A1 | 6/2004 | Maeda et al. | |
| 2004/0151222 A1 | 8/2004 | Sekine | |
| 2004/0196877 A1 | 10/2004 | Kawakami et al. | |
| 2004/0222357 A1 | 11/2004 | King et al. | |
| 2004/0233950 A1 | 11/2004 | Furukawa et al. | |
| 2004/0247275 A1 | 12/2004 | Vakhshoori et al. | |
| 2004/0262624 A1 | 12/2004 | Akita et al. | |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0214992 A1 | 9/2005 | Chakraborty et al. | |
| 2005/0218413 A1 | 10/2005 | Matsumoto et al. | |
| 2005/0224826 A1 | 10/2005 | Keuper et al. | |
| 2005/0229855 A1 | 10/2005 | Raaijmakers | |
| 2005/0230701 A1 | 10/2005 | Huang | |
| 2005/0247260 A1 | 11/2005 | Shin et al. | |
| 2005/0285128 A1 | 12/2005 | Scherer et al. | |
| 2005/0286591 A1 | 12/2005 | Lee | |
| 2006/0030738 A1 | 2/2006 | Vanmaele et al. | |
| 2006/0033009 A1 | 2/2006 | Kobayashi et al. | |
| 2006/0037529 A1 | 2/2006 | D'Evelyn | |
| 2006/0038193 A1 | 2/2006 | Wu et al. | |
| 2006/0060131 A1 | 3/2006 | Atanackovic | |
| 2006/0066319 A1 | 3/2006 | Dallenbach et al. | |
| 2006/0077795 A1 | 4/2006 | Kitahara et al. | |
| 2006/0078022 A1 | 4/2006 | Kozaki et al. | |
| 2006/0079082 A1 | 4/2006 | Bruhns et al. | |
| 2006/0086319 A1 | 4/2006 | Kasai et al. | |
| 2006/0118799 A1 | 6/2006 | D'Evelyn et al. | |

(56) References Cited

U.S. PATENT DOCUMENTS

| | | |
|---|---|---|
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0094592 A1 | 4/2008 | Shibazaki |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0005853 A1 | 1/2009 | Osman |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0170569 A1 | 7/2011 | Tyagi et al. |
| 2011/0180781 A1 | 7/2011 | Raring et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Iell |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0119218 A1 | 5/2012 | Su |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 1171692 | 4/2008 |
| JP | 3-287770 | 12/1991 |
| JP | 2007-173467 A | 7/2007 |
| JP | 2007-068398 | 4/2008 |
| JP | 2008-205231 | 9/2008 |
| JP | 2008-300547 | 12/2008 |
| JP | 2008-306062 | 12/2008 |
| JP | 2008-311640 | 12/2008 |
| WO | 2004/084275 | 9/2004 |
| WO | 2008-041521 A1 | 4/2008 |
| WO | 2010/120819 | 10/2010 |

OTHER PUBLICATIONS

Non-Final Office Action of Apr. 3, 2014 for U.S. Appl. No. 12/759,273, 30 pages.

Abare "Cleaved and Etched Facet Nitride Laser Diodes," IEEE Journal of Selected Topics in Quantum Electronics, vol. 4, No. 3, pp. 505-509 (May 1998).

(56) References Cited

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993,"IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Feezell et al.; "Short-Wave Diode Lasers: Nonpolar gallium nitride laser diodes are the next new blue"; Laser Focus World; Oct. 1, 2007; vol. 43, Issue 10 Retrieved from the Internet: <URL:http://www.laserfocusworld.com/content/lfw/en/articles/print/volume-43/issue-10/features/short-wave-diode-lasers-nonpolar-gallium-nitride-laser-dio-des-are-the-next-new-blue.html >.

Franssila, 'Tools for CVD and Epitaxy', Introduction to Microfabrication, 2004, pp. 329-336.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Gardner et al. "Blue-emitting InGaN—GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express Letter, vol. 46, No. 9, 2007 pp. L187-L189.

Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Schoedl "Facet degradation of GaN heterostructure laser diodes," Journal of Applied Physics vol. 97, issue 12, pp. 123102-1 to 123102-8 (2005).

Shchekin et al., "High Performance Thin-film Flip-Chip InGaN—GaN Light-emitting Diodes," 2006, Applied Physics Letters, Volume 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AIGaInN Flip-chip Light-emitting Diodes," 2001, Applied Physics Letters, vol. 78, No. 22, pp. 3379-3381.

(56) References Cited

OTHER PUBLICATIONS

Yamaguchi, A. Atsushi, "Anisotropic Optical Matrix Elements in Strained GaN-quantum Wells with Various Substrate Orientations,"2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009).

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

International Search Report of PCT Application No. PCT/US2009/047107, dated Sep. 29, 2009, 4 pages.

International Search Report of PCT Application No. PCT/US2009/046786, dated May 13, 2010, 2 pages.

International Search Report of PCT Application No. PCT/US2009/52611, dated Sep. 29, 2009, 3 pages.

International Search Report & Written Opinion ofPCT Application No. PCT/US2010/030939, dated Jun. 16, 2010, 9 pages.

International Search Report & Written Opinion of PCT Application No. PCT/US2010/049172, dated Nov. 17, 2010, 7 pages.

International Search Report of PCT Application No. PCT/US2011/037792, dated Sep. 8, 2011, 2 pages.

International Search Report & Written Opinion of PCT Application No. PCT/US2011/060030,dated Mar. 21, 2012, 11 pages.

Non-Final Office Action of Nov. 21, 2011 for U.S. Appl. No. 12/759,273, 10 pages.

Final Office Action of Jun. 26, 2012 for U.S. Appl. No. 12/759,273, 12 pages.

Non-Final Office Action of Nov. 20, 2013 for U.S. Appl. No. 13/549,335, 12 pages.

Notice of Allowance of Oct. 22, 2014 for U.S. Appl. No. 14/229,738, 16 pages.

Final Office Action of Oct. 24, 2014 for U.S. Appl. No. 12/759,273, 16 pages.

\* cited by examiner

405nm Laser Status

- Characteristics (CW)
  - $Power_{CW} >$ 350mW
  - Kink-free operation
  - $I_{th} <$ 30mA
  - $SE >$ 1.0 W/A
  - Packaged on TO-56 header

OPTICAL DEVICE STRUCTURE USING GAN SUBSTRATES FOR LASER APPLICATIONS

CROSS-REFERENCE TO RELATED APPLICATIONS

This application is a continuation of U.S. Ser. No. 12/868,441, filed Aug. 25, 2010, which is a continuation-in-part of U.S. Ser. No. 12/759,273, filed Apr. 13, 2010; which claims priority to U.S. Ser. No. 61/168,926, filed Apr. 13, 2009; and U.S. Ser. No. 61/243,502, filed Sep. 17, 2009, each of which is commonly assigned and hereby incorporated by reference herein.

BACKGROUND OF THE INVENTION

This invention is directed to optical devices and related methods. More particularly, the invention provides a method and device for emitting electromagnetic radiation using nonpolar gallium containing substrates such as GaN, AlN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors, as well as other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb:

- The conventional light bulb dissipates much thermal energy. More than 90% of the energy used for the conventional light bulb dissipates as thermal energy.
- Reliability is an issue since the conventional light bulb routinely fails often due to thermal expansion and contraction of the filament element.
- Light bulbs emit light over a broad spectrum, much of which does not result in bright illumination or due to the spectral sensitivity of the human eye.
- Light bulbs emit in all directions and are not ideal for applications requiring strong directionality or focus such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state lasers had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the efficiency of the LPSS lasers, and further commercialization ensue into more high-end specialty industrial, medical, and scientific applications. However, the change to diode pumping increased the system cost and required précised temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

This invention provides a method and device for emitting electromagnetic radiation using nonpolar or semipolar gallium containing substrates such as GaN, AlN, InN, InGaN, AlGaN, and AlInGaN, and others. In a specific embodiment, the electromagnetic radiation has a wavelength of 405, 450, 485, 500, 520, nanometers and others.

In a specific embodiment, the invention provides an optical device. The optical device includes a gallium nitride substrate member having an m-plane nonpolar crystalline surface region characterized by an orientation of about −2 degrees to about 2 degrees towards (0001) and less than about +/−0.5 degrees towards (11-20) or preferably about −1 degree towards (0001) and less than about +/−0.3 degrees towards (11-20). In a specific embodiment, the crystalline surface can be characterized as a miscut and does not include a cut orientation of zero degrees. The device also has a laser stripe region formed overlying a portion of the m-plane nonpolar crystalline orientation surface region. In a preferred embodiment, the laser stripe region is characterized by a cavity orientation that is substantially parallel to the c-direction, the laser stripe region having a first end and a second end. The device includes a first cleaved c-face facet provided on the first end of the laser stripe region. In a specific embodiment, the first cleaved c-face facet is characterized by a laser scribed region. The device also has a second cleaved c-face facet provided on the second end of the laser stripe region. In a specific embodiment, the second cleaved c-face facet is characterized by a laser scribed region. In a preferred embodiment, the second cleaved c-face facet is exposed, is substantially free from an optical coating, or is exposed gallium and nitrogen containing material and the second cleaved c-face facet comprises a reflective coating. Of course, there can be other variations, modifications, and alternatives.

In a specific embodiment, the invention provides an optical device. The optical device includes a gallium nitride substrate member having an m-plane nonpolar crystalline surface region characterized by an orientation of about −17 degrees to about 17 degrees towards a c-plane. In a specific embodiment, the crystalline surface can be characterized as a miscut and does not include a cut orientation of zero degrees. The device also has a laser stripe region formed overlying a portion of the m-plane nonpolar crystalline orientation surface region or alternatively the semipolar crystalline orientation surface region. In a preferred embodiment, the laser stripe region is characterized by a cavity orientation that is substantially parallel to the c-direction or the projection of the c-direction. In a preferred embodiment, the laser stripe region has a first end and a second end. The device includes a first cleaved face facet provided on the first end of the laser stripe region. In a specific embodiment, the first cleaved face facet is characterized by a laser scribed region. The device also has a second cleaved face facet provided on the second end of the laser stripe region. In a specific embodiment, the second cleaved face facet is characterized by a laser scribed region. In a preferred embodiment, the first cleaved facet comprises a reflective coating and the second cleaved facet comprises no coating, an antireflective coating, or exposes gallium and nitrogen containing material.

In an alternative specific embodiment, the invention provides a method for forming an optical device. The method includes providing a gallium nitride substrate member having an m-plane nonpolar crystalline surface region characterized by an orientation of about −2 degrees to about 2 degrees towards (0001) and less than about 0.5 degrees towards (11-20) or preferably about −1 degree towards (0001) and less than about +/−0.3 degrees towards (11-20). In a specific embodiment, the crystalline surface can be characterized as a miscut and does not include a cut orientation of zero degrees. The device also has a laser stripe region formed overlying a portion of the m-plane nonpolar crystalline orientation surface region. In a specific embodiment, the laser stripe region is characterized by a cavity orientation substantially parallel to the c-direction. In a specific embodiment, the laser stripe region has a first end and a second end. The method preferably forms a pair of cleaved facets including a first cleaved c-face facet provided on the first end of the laser stripe region and a second cleaved c-face facet provided on the second end of the laser stripe region.

In other embodiments, the invention includes a device and method configured on other gallium and nitrogen containing substrate orientations. In a specific embodiment, the gallium and nitrogen containing substrate is configured on a family of planes including a {20-21} crystal orientation. In a specific embodiment, {20-21} is 14.9 degrees off of the m-plane towards the c-plane (0001). As an example, the miscut or off-cut angle is +/−17 degrees from the m-plane towards c-plane or alternatively at about the {20-21} crystal orientation plane. As another example, the present device includes a laser stripe oriented substantially in a projection of the c-direction, which is perpendicular to the a-direction (or alternatively on the m-plane, it is configured in the c-direction). In one or more embodiments, the cleaved facet would be the gallium and nitrogen containing face (e.g., GaN face) that is +1-5 degrees from a direction orthogonal to the projection of the c-direction (or alternatively, for the m-plane laser, it is the c-face). Of course, there can be other variations, modifications, and alternatives.

In further specific embodiment, the invention provides a laser device comprising a gallium and nitrogen containing substrate having a surface region configured in a non-polar orientation, an active region comprising a plurality of quantum well regions and at least a pair of thin barrier regions configured on each of the sides of at least one of plurality of quantum well regions. That is, the quantum well region is sandwiched between the pair of barrier region in a specific embodiment.

In a specific embodiment, the invention provides a laser device comprising a gallium and nitrogen containing substrate having a surface region configured in a non-polar orientation, an active region comprising at least five quantum well regions and at least four thin barrier regions configured to separate respective first quantum well region, second quantum well region, third quantum well region, fourth quantum well region, and fifth quantum well region. That is, a first barrier region separates the first from the second quantum well region, a second barrier region separates the second quantum well region from the third quantum well region, a third barrier region separates the third quantum well region from the fourth quantum well region, and the fourth barrier region separates the fourth quantum well region from the fifth quantum well region. In a preferred embodiment, each of the barrier regions is thin and is characterized by a thickness of 2.5 nm and less, which leads to reduced overall strain in the active region including both the quantum well regions and barrier regions. As used herein, the second, third, and fourth quantum well regions are configured within the first and fifth quantum well regions, which are configured within a vicinity of exterior portions of the active region. Of course, one of ordinary skill in the art would recognize that there may be more than five quantum well regions or fewer than five quantum well regions.

Moreover, the invention provides a gallium and nitrogen containing optical device comprising a gallium and nitrogen containing substrate comprising a surface region configured in a semi-polar {20-21} orientation; an active region comprising a plurality of quantum well regions and at least a pair of thin barrier regions configured on respective sides of at least one of the plurality of quantum well regions; and a laser stripe region configured in a projection of a c-direction.

The present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a nonpolar gallium nitride material capable of achieving a laser having a wavelength of about 400 nanometers to about 500 nanometers and greater, among others. In other embodiments, the device and method can achieve a wavelength of about 500 nanometers and greater including 520 nanometers to about 540 nanometers. In a specific embodiment, the method and device can achieve a wavelength of 435 to 470 nanometers, among others. In a preferred embodiment, the single lateral mode laser device is characterized by a wall plug efficiency (optical power out/electrical power in) of about 14-25% in the 50 to 150 mW output power range for a laser configured on a non-polar gallium and nitrogen containing material. The wall plug efficiency of the single lateral mode laser device can be characterized by values greater than 20%. In such embodiments, the electrical power may range from about 50 mW to about 200 mW and can be greater such as 200 mW to about 500 mW and can be others. In other embodiments, the present laser device configured on a semi-polar substrate orientation (e.g., {20-21}, slightly offcut {20-21}) provides wall plug efficiencies of 6% to 12% and greater for emission of 520 nanometers and greater. In a specific embodiment, the present device can be configured as a single lateral mode or multi-mode devices. In a preferred embodiment, the present single lateral mode device has a wall plug efficiency of 15 to 25% and may be at least 1.5 to 2× higher than conventional single lateral mode devices operating in the 435 to 470 nanometer range. In a preferred embodiment, the present laser devices uses a multi-quantum well structure configured with thin barrier regions for improved device performance, including higher wall plug efficiency and desirable other desirable electrical properties. Depending upon the embodiment, one or more of these benefits may be achieved. These and other benefits may be described throughout the present specification and more particularly below.

A further understanding of the nature and advantages of the present invention may be realized by reference to the latter portions of the specification and attached drawings.

DETAILED DESCRIPTION OF THE INVENTION

According to the present invention, techniques related generally to optical devices are provided. More particularly, the present invention provides a method and device for emitting electromagnetic radiation using non-polar or semipolar gallium containing substrates such as GaN, AlN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors, among other devices.

Figure 1:
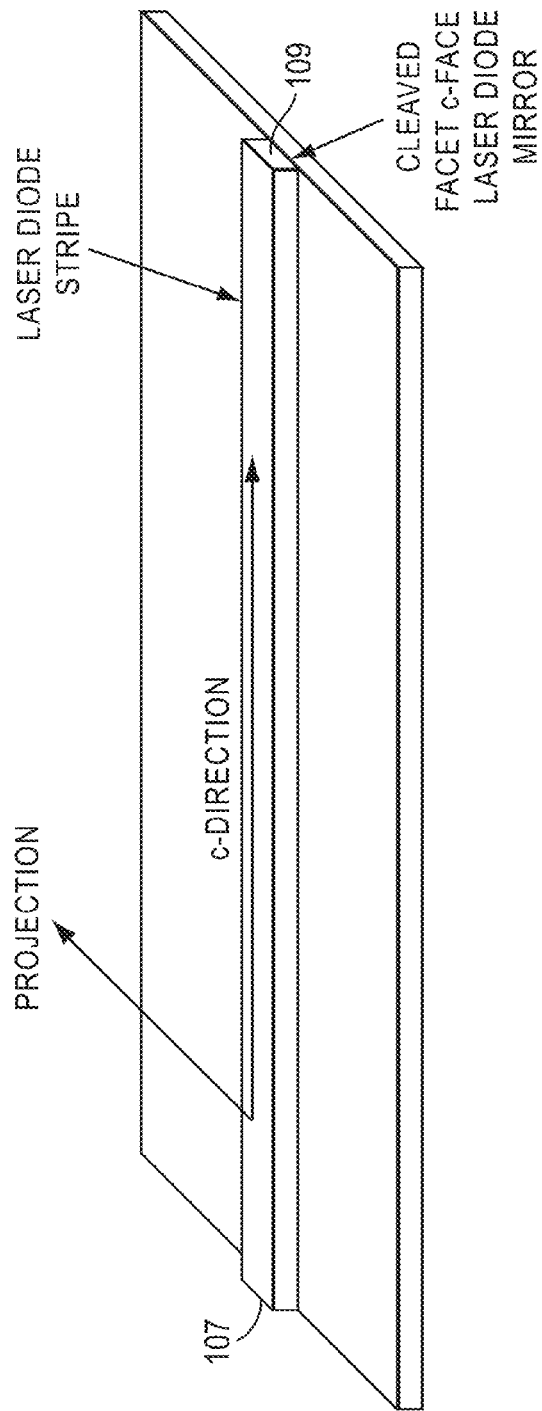
FIG. 1 is a simplified perspective view of a laser device fabricated on a nonpolar substrate according to an embodiment of the present invention.

FIG. 1 is a simplified perspective view of a laser device 100 fabricated on a nonpolar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having a nonpolar crystalline surface region characterized by an orientation of about −2 degrees to about 2 degrees towards (0001) and less than about 0.5 degrees towards (11-20). In a specific embodiment, the gallium nitride substrate member is a bulk GaN substrate characterized by having a nonpolar crystalline surface region, but can be others. In a specific embodiment, the bulk GaN substrate has a surface dislocation density below $10^5$ cm$^{-2}$ or 10E5 to 10E7 cm-2. It should be noted that homoepitaxial growth on bulk GaN is generally better than hetero-epitaxy growth. The nitride crystal or wafer may comprise $Al_xIn_yGa_{1-x-y}N$, where 0≤x, y, x+y≤1. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$ or others such as those ranging from about 10E5-10E8 cm-2.

In a specific embodiment, the device has a laser stripe region formed overlying a portion of the nonpolar crystalline orientation surface region. In a specific embodiment, the laser stripe region is characterized by a cavity orientation is substantially parallel to the c-direction. In a specific embodiment, the laser stripe region has a first end 107 and a second end 109.

In a preferred embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. In a specific embodiment, deposition of the reflective coating occurs using, for example, electron beam (ebeam) evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed cleaved surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating.

Also in a preferred embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, titania, tantalum pentoxide, zirconia, combinations, and the like. In a specific embodiment, the second mirror surface comprises an anti-reflective coating. In a specific embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed cleaved surface prior to coating.

In a specific embodiment, the laser stripe has a length and width. The length ranges from about 50 microns to about 3000 microns. The stripe also has a width ranging from about 0.5 microns to about 50 microns, but can be other dimensions. In a specific embodiment, the stripe can also be about 1 to 20 microns or 1 to 2 microns for a single lateral mode laser device. In a specific embodiment, the width is substantially constant in dimension, although there may be slight variations. The width and length are often formed using a masking and etching process, which are commonly used in the art.

In a specific embodiment, the device is also characterized by a spontaneously emitted light is polarized in substantially perpendicular to the c-direction. That is, the device performs as a laser or the like. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 400 nanometers to yield a violet emission, a blue emission, a green emission, and others. In other embodiments, the wavelength range is within about 405 nm or slightly more or less. In one or more embodiments, the light can be emissions ranging from violet 395 to 420 nanometers; blue 430 to 470 nm; green 500 to 540 nm; and others, which may slightly vary depending upon the application. In a preferred embodiment, the spontaneously emitted light is in the wavelength range of 430 nm and greater and is highly polarized with a polarization ratio of greater than 0.4. In a preferred embodiment, the spontaneous polarization ratio is greater than 0.3 for an emission polarized perpendicular to the c-direction for a spontaneous emission peak wavelength greater than 430 nm. In a specific embodiment, the emitted light is characterized by a polarization ratio that is desirable.

Figure 2:
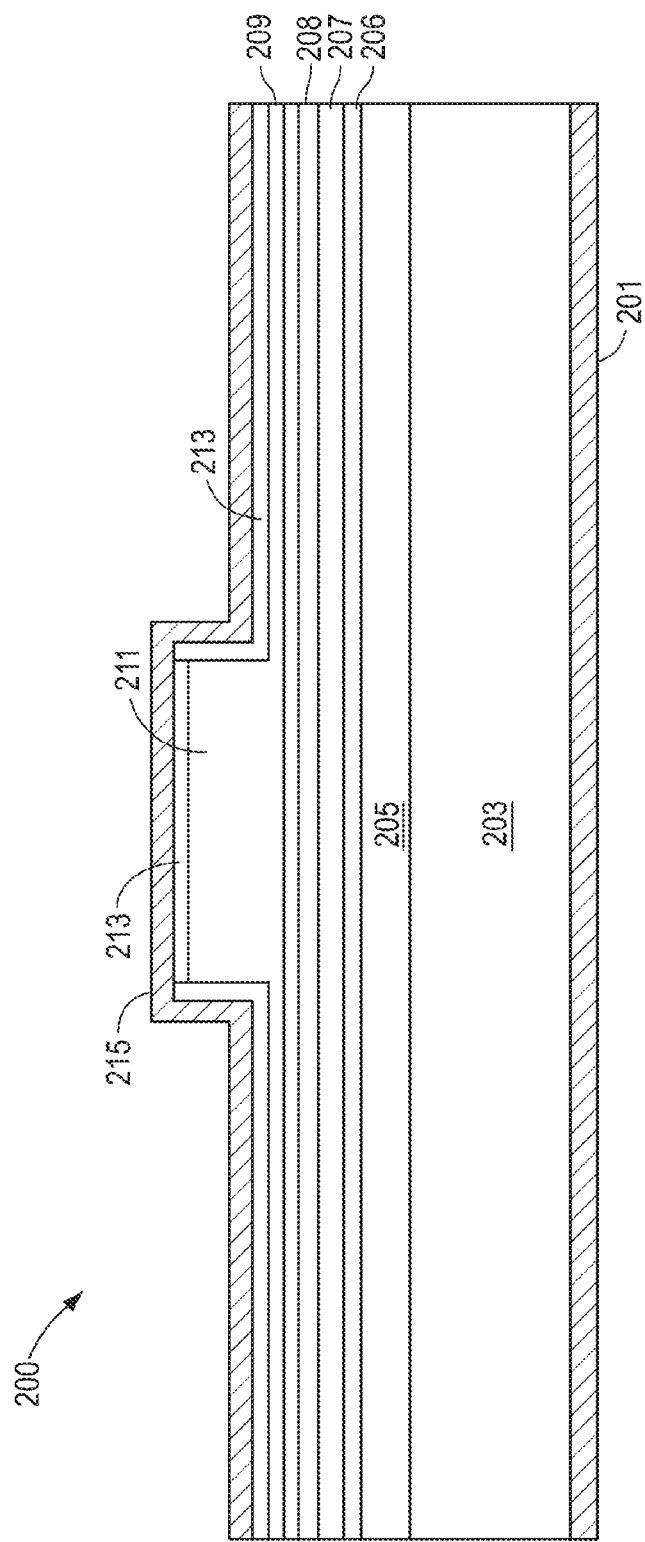
FIG. 2 is a detailed cross-sectional view of a laser device fabricated on a nonpolar substrate according to an embodiment of the present invention.

FIG. 2 is a detailed cross-sectional view of a laser device 200 fabricated on a nonpolar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others.

In a specific embodiment, the device also has an overlying n-type gallium nitride layer 205, an active region 207, and an overlying p-type gallium nitride layer structured as a laser stripe region 211. Additionally, the device also includes an n-side separate confinement hetereostructure (SCH) 206, p-side guiding layer or SCH 208, p-AlGaN EBL 209, among other features. In a specific embodiment, the device also has a p++ type gallium nitride material 213 to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about 10E19 to 10E21 Mg/centimeter$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type Al$_u$In$_v$Ga$_{1-u-v}$N layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In one specific embodiment, the susceptor is heated to approximately about 900 to about 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm is initiated.

In a specific embodiment, the laser stripe region is made of the p-type gallium nitride layer 211. In a specific embodiment, the laser stripe is provided by an etching process selected from dry etching or wet etching. In a preferred embodiment, the etching process is dry, but can be others. As an example, the dry etching process is an inductively coupled plasma (ICP) process using chlorine bearing species or a reactive ion etching (RIE) process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++ gallium nitride region. In a specific embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and platinum (Pt/Au) or nickel and gold (Ni/Au), but can be others. In a specific embodiment, the Ni/Au is formed via electro-beam deposition, sputtering, or any like techniques. The thickness includes nickel material ranging in thickness from about 50 to about 100 nm and gold material ranging in thickness from about 1000 Angstroms to about 1-3 microns, and others.

In a preferred embodiment, the dielectric region can be made using a suitable technique. As an example, the technique may include reactively sputter of SiO2 using an undoped polysilicon target (99.999% purity) with O2 and Ar. In a specific embodiment, the technique uses RF magnetron sputter cathodes configured for static deposition; sputter target; throw distance; pressure: 1-5 mT or about 2.5 mT, power: 300 to 400 W; flows: 2-3.-9 sccm O2, 20-50 sccm, Ar, deposition thickness: 1000-2500 A, and may include other variations. In a specific embodiment, deposition may occur using non-absorbing, nonconductive films, e.g., Al2O3, Ta2O5, SiO2, Ta2O5, ZrO2, TiO2, HfO2, NbO2. Depending upon the embodiment, the dielectric region may be thinner, thicker, or the like. In other embodiments, the dielectric region can also include multilayer coatings, e.g., 1000 A of SiO2 capped with 500 A of Al2O3. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. Preferably, the active layer may include about 3-7 quantum wells or more preferably 4-6 quantum wells or others. The quantum wells may comprise InGaN wells and GaN or InGaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In a preferred embodiment, each of the thicknesses is preferably 1-8 nm. In a specific embodiment, each well region may have a thickness of about 4 nm to 6 nm and each barrier region may have a thickness of about 1 nm to about 5 nm, among others. In alternative specific embodiment, each well region may have a thickness of about 4 nm to 6 nm and each barrier region may have a thickness of about 1 nm to about 3 nm, among others. In alternative specific embodiment, each well region may have a thickness of about 2.5 nm to 4.5 nm and each barrier region may have a thickness of about 2 nm to about 4 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In a specific embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to a specific embodiment. In one or more embodiments, the SCH layers have a desirable thickness, impurity, and configuration above and below the active region to confine the optical mode. Depending upon the embodiment, the upper and lower SCH can be configured differently or the same. The electron blocking region can be on either side or both sides of the SCH positioned above the active region according to a specific embodiment. In a preferred embodiment, the lower SCH can range from about 10 nm to about 150 nm, and preferably about 40 to 120. The lower SCH is preferably InGaN having with about 2% to about 10% indium by atomic percent according to a specific embodiment. In a preferred embodiment the upper SCH region thickness ranges from about 10 to 150 nm, and preferably about 10 nm to 50 nm. The upper SCH is preferably GaN or InGaN having about 0% to about 5% indium by atomic percent according to a specific embodiment. In the case that that there is no indium in this upper layer, the layer can be referred to as an p-side guiding layer that is comprised of GaN.

In some embodiments, an electron blocking layer is preferably deposited. In a specific embodiment, the electron blocking layer comprises a gallium and nitrogen containing material including magnesium 10E16 cm-3 to about 10E22 cm-3. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN with an Al composition ranging from 10 to 20%. In another specific embodiment, the electron blocking layer comprises AlGaN with an Al composition ranging from 3 to 10%. In another embodiment, the electron blocking layer may not contain Al. In another embodiment, the electron blocking layer comprises an AlGaN/GaN super-lattice structure, comprising alternating layers of AlGaN and GaN, each with a thickness between about 0.2 nm and about 5 nm.

In some embodiments, there may not be an electron blocking layer. In a specific embodiment, the AlGaN blocking layer is replaced by a GaN layer doped with magnesium from about 10E16 cm-3 to about 10E22 cm-3.

In a specific embodiment, the present invention provides a laser device and related methods using thin barrier materials to achieve improved performance. In a specific embodiment for a nonpolar blue laser with multi-quantum well (MQW) active regions comprised of 4-7 QWs with thicknesses in the 4 to 6 nm range, barrier thicknesses in the 1.5 nm to 2.5 nm range provide the lowest threshold current, highest slope efficiency, and lower forward voltage. Blue laser diodes employing such MQW active regions with 3 or more, or 5 or more QWs fabricated on conventional c-plane GaN would be impractical due to the high strain accumulation, which would likely lead to the onset of defects.

By reducing the barrier thickness to the present ultra-thin 1.5 to 2.5 nm regime, the outer quantum wells within the active region are pushed in towards the peak of the optical mode. In other embodiments, the ultra-thin barrier can be 1.0 nm and less, although there can be some variations. In other embodiments, the ultra-thin barrier can be 2.5 nm and less or 2.0 nm and less. This results in higher optical overlap of the electric field and the quantum wells within the laser. Since the modal gain of a laser is given by the product of the material gain and the optical confinement, this increase in the optical confinement results in increased modal gain. Increased gain reduces the threshold current density, and hence reduces the threshold current in a laser with a given cavity dimension.

Thin barriers can further increase the laser performance by again increasing the modal gain and by reducing absorption losses in the quantum wells by promoting a more uniform carrier distribution throughout the quantum wells according to a specific embodiment. The heavy effective mass of holes typically limits carrier transport in multi-quantum well InGaN-based devices. With a reduced total transport length from the p-side of the active region where holes are injected to the lower quantum wells towards the n-side, holes are more readily able to travel to the lowest quantum wells before recombining with an electron. Such thin barriers increase the probability for holes to tunnel through the barriers such that they do not need to overcome the potential energy of the hole/barrier hetereointerface. This again promotes more uniform carrier filling of the quantum wells. This more uniform carrier distribution profile assures that no wells are left un-pumped such that they are absorbing or lossy to the optical mode. The higher loss associated with insufficiently pumped wells leads to an increased threshold current and a decreased slope efficiency. Further, the carrier uniformity prevents the case where a majority of the carriers are recombining in only some of the quantum wells such that the carrier concentration would become very high in those wells and the gain would saturate. A uniform carrier distribution guarantees that each quantum well is kept as far from gain saturation as possible for a given laser injection current.

A reduced transport length and a higher probability for carrier tunneling through the barriers could also reduce the forward voltage of the laser diode. Again, there can be other variations, modifications, and alternatives. As an alternative example for the present semipolar green laser operating in the 510 to 530 nm range, thin barriers can also be employed. In one embodiment for a green laser structure, 4 to 5 quantum wells with thicknesses that range from 3 nm to 4.5 nm and barriers that range in thickness from 2 nm to 4.5 nm can be employed.

As noted, the p-type gallium nitride structure, which can be a p-type doped $Al_qIn_rGa_{1-q-r}N$, where $0 \le q, r, q+r \le 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In a specific embodiment, a ridge waveguide is fabricated using a certain deposition, masking, and etching processes. In a specific embodiment, the mask is comprised of photoresist (PR) or dielectric or any combination of both and/or different types of them. The ridge mask is 1 to 2.5 microns wide for single lateral mode applications or 2.5 to 30 um wide for multimode applications. The ridge waveguide is etched by ion-coupled plasma (ICP), reactive ion etching (RIE), or other method. The etched surface is 25-250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80-400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au.

Figure 3:
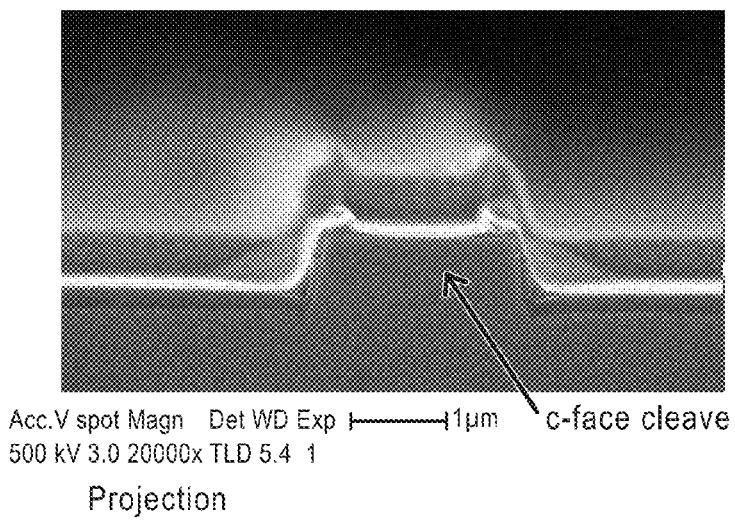
FIG. 3 is a cross-sectional view photograph of a c-direction cleaved facet for a laser device according to an embodiment of the present invention.

FIG. 3 is a cross-sectional view photograph of a c-direction cleaved facet for a laser device according to an embodiment of the present invention. This diagram is merely an example, which should not unduly limit the scope of the claims herein. One of ordinary skill in the art would recognize other variations, modifications, and alternatives. As shown, the c-direction cleaved facet is smooth and provides a suitable mirror surface.

Figure 4:
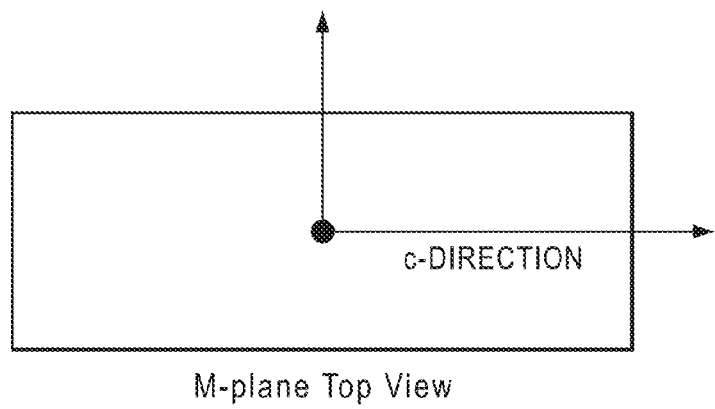
FIG. 4 is a top-view diagram of a laser device according to an embodiment of the present invention.

FIG. 4 is a top-view diagram of a laser device according to an embodiment of the present invention. This diagram is merely an example, which should not unduly limit the scope of the claims herein. One of ordinary skill in the art would recognize other variations, modifications, and alternatives. As shown, the laser stripe is configured in the c-direction, which has a projection normal to the c-direction. As shown, the top-view of the gallium nitride substrate is of a slight mis-cut or off-cut surface region orientation according to a specific embodiment.

Figure 5:
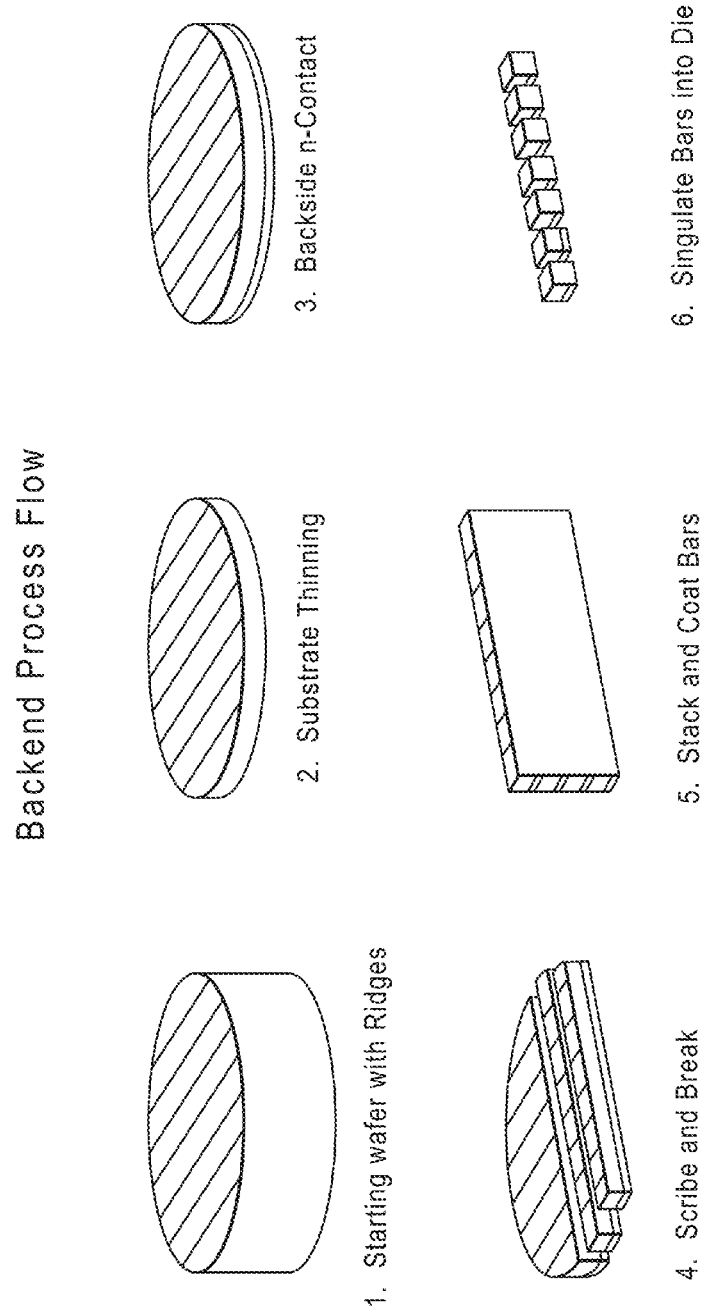
FIGS. 5 to 12 illustrate a simplified backend processing method of a laser device according to one or more embodiments of the present invention.

A method of processing a laser device according to one or more embodiments may be outline as follows, see also FIG. 5:
1. Start;
2. Provide processed substrate including laser devices with ridges;
3. Thin substrate from backside;
4. Form backside n-contact;
5. Scribe pattern for separation of the laser devices configured in bar structures;
6. Break scribed pattern to form a plurality of bar structures;
7. Stack bar structures;
8. Coat bar structures;
9. Singulate bar structures into individual dies having laser device; and
10. Perform other steps as desired.

The above sequence of steps is used to form individual laser devices on a die from a substrate structure according to one or more embodiments of the present invention. In one or more preferred embodiments, the method includes cleaved facets substantially parallel to each other and facing each other in a ridge laser device configured on a non-polar gallium nitride substrate material. Depending upon the embodiment, one or more of these steps can be combined, or removed, or other steps may be added without departing from the scope of the claims herein. One of ordinary skill in the art would recognize other variations, modifications, and alternatives.

Figure 6:
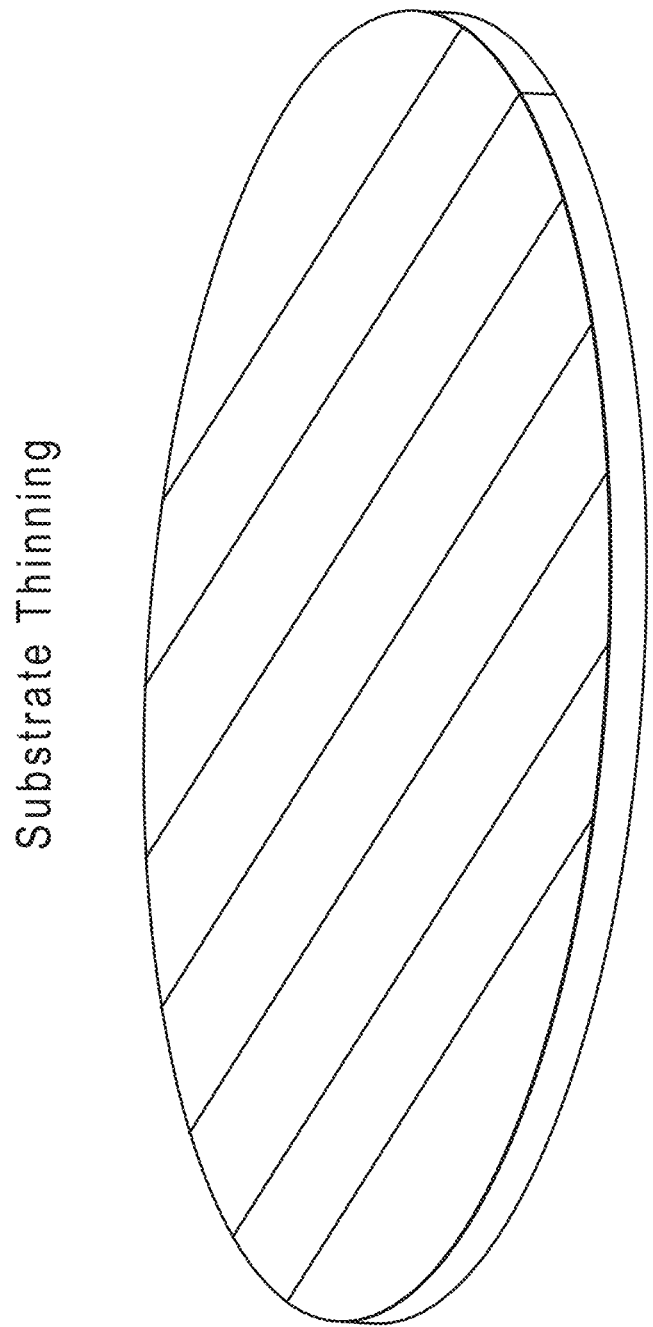

FIG. 6 is a simplified illustration of a substrate thinning process according to an embodiment of the present invention. This diagram is merely an illustration and should not unduly limit the scope of the claims herein. One of ordinary skill in the art would recognize other variations, modifications, and alternatives. In a specific embodiment, the method begins with a gallium nitride substrate material including laser devices and preferably ridge laser devices, but can be others. The substrate has been subjected to frontside processing according to a specific embodiment. After frontside processing has been completed, one or more of the GaN substrates are mounted onto a sapphire carrier wafer or other suitable member. As an example, the method uses Crystalbond 509, which is a conventional mounting thermoplastic. The thermoplastic can be dissolved in acetone or other suitable solvent.

In a specific embodiment, the carrier wafer is mounted to a lapping jig. An example of such lapping jig is made by Logitech Ltd. of the United Kingdom, or other vendor. The lapping jig helps maintain planarity of the substrates during the lapping process according to a specific embodiment. As an example, the starting thickness of the substrates are ~325 um+/−20 um, but can be others, e.g., 250 to about 500 um. In a specific embodiment, the method laps or thins the substrates down to 60-70-80 um thickness, but can also be thinner or slightly thicker. In a preferred embodiment, the lapping jig is configured with a lapping plate, which is often made of a suitable material such as cast iron configured with a flatness of less than 5 um, but can be others. Preferably, the method uses a lapping slurry that is 1 part silicon carbide (SiC) and 10 parts water, but can also be other variations. In a specific embodiment, the SiC grit is about 5 um or 9 micron and others in dimension. In one or more embodiments, the lapping plate speed is suitable at about 10 revolutions per minute. Additionally, the method can adjust the lapping jig's down pressure to achieve a desired lapping rate, such as 2-3 um/min or greater or slightly less according to one or more embodiments.

In a preferred embodiment, the present method uses a suitable lapping process. Such process includes use of a Logitech LP50 lapping/polishing system using a suitable slurry mixture. The slurry may include a SiC slurry such as 9 um SiC slurry (from Logitech), among others. The slurry may be mixed with a SiC to water ratio such as 1:10 SiC:H2O, or others, e.g., 1-3:8-12. In a preferred embodiment, the lapping occurs at about 5 to about 50 rpm and is preferably about 10 rpm, which achieves a removal rate of about 1-5 um/min removal rate. Lapping occurs until the thickness of the substrate is about 80 um or 75 um and less. In other variations, grin ding may be used to replace or supplement lapping. Other variations include other lapping materials and grits, such as Al2O3, diamond, boron nitride, combinations, and others. Grit size can also range from about 1 um, 3 um, 5 um, 15 um, combinations, and others. Lapping is often followed by polishing, which will be described in more detail below.

In a specific embodiment, the present method uses a suitable polishing process. In a specific embodiment, polishing occurs using the Logitech LP50 lapping/polishing system. In a specific embodiment, diamond polishing material includes a 1 um diamond suspension (from Eminess) configured on a polish pad, e.g., SUBA IV, 40-80 rpm or 70 rpm, but can be others. The polishing occurs to achieve a 3-5 um/hr removal rate and removes about 5 to 10 microns of substrate material, which leaves the substrate thickness at about 65 um. In other embodiments, polishing may be optional.

In a specific embodiment, the present method includes a lapping process that may produce subsurface damage in the GaN material to cause generation of mid level traps or the like. The midlevel traps may lead to contacts having a Schottky characteristic. Accordingly, the present method includes one or more polishing processes such that ~10 um of material having the damage is removed according to a specific embodiment. As an example, the method uses a Politex™ polishing pad of Rohm and Haas, but can be others, that is glued onto a stainless steel plate. A polishing solution is Ultrasol300K manufactured by Eminess Technologies, but can be others. The Ultra-Sol 300K is a high-purity colloidal silica slurry with a specially designed alkaline dispersion. It contains 70 nm colloidal silica and has a pH of 10.6 in a specific embodiment. The solids content is 30% (by weight), but can range from about 20 to 50% by weight. In a specific embodiment, the lapping plate speed is 70 rpm (or range from about 40 to 100 rpm) and the full weight of the lapping jig is applied. In a preferred embodiment, the method includes a polishing rate of about ~2 um/hour, but can be others, which are higher or lower.

In other embodiments, the present invention provides a method for achieving high quality n-type contacts for m-plane GaN substrate material. In a specific embodiment, the method provides contacts that are rough to achieve suitable ohmic contact. In a specific embodiment, the roughness causes exposure of other crystal planes, which lead to good contacts. In a preferred embodiment, the present method includes a lapped surface, which is rough in texture to expose more than one or multiple different crystal planes. In other embodiments, lapping may be followed by etching such as dry etching with (Cl2/BCl3)/SiCl4/Cl2 based chemistries and/or wet etching. In a specific embodiment, etching removes the subsurface damage, however, it is likely not to planarize the surface like polishing.

Figure 7:
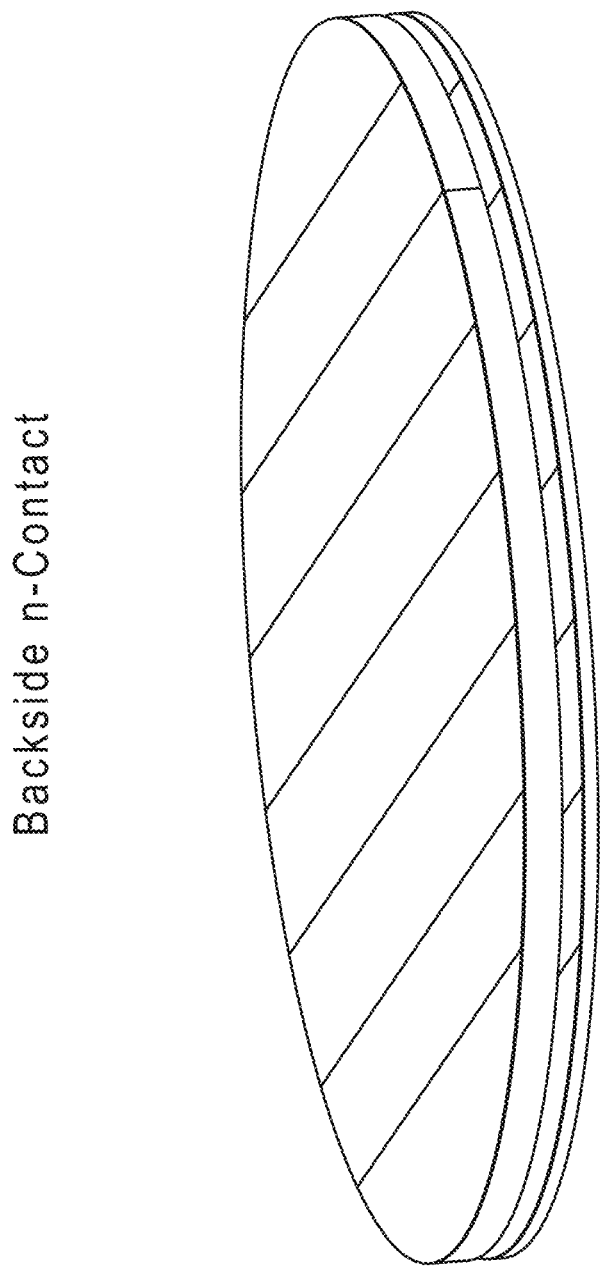

FIG. 7 is a simplified diagram illustrating a backside n-contact method according to one or more embodiments. This diagram is merely an illustration and should not unduly limit the scope of the claims herein. One of ordinary skill in the art would recognize other variations, modifications, and alternatives. After the thinning process is complete, the method forms n-contacts on the backside of the substrates according to one or more embodiments. At this point, the thinned substrates are still mounted to and maintained on the sapphire wafer. In a preferred embodiment, the thinned substrates are "batch process" for efficiency and handling. In a specific embodiment, the method using batch processing helps prevent any damage associated with handling very thin (60-80 um) substrates.

In a specific embodiment, the backside contact regions are formed using laser irradiation as a pre-treatment before contact formation. In a specific embodiment, the laser irradiation can be performed using a scribing process by way of laser irradiation. An example is described in U.S. Ser. No. 61/345, 561, which is commonly assigned, and hereby incorporated by reference.

As an example, the backside contact includes about 300 Å Al/3000 Å Au or other suitable materials. In a specific embodiment, the contact is a stack of metals that are deposited by e-beam evaporation or other suitable techniques. In a specific embodiment, the contacts can include aluminum/nickel/gold materials having respective thicknesses of, for example, 300/1000/3000 Angstroms or Ti/Pt/Au materials having respective thicknesses of, for example, 200/400/3000 Angstroms, or others. In a preferred embodiment and prior to the metal stack deposition, the method includes use of a wet etch such as a hydrofluoric acid or hydrochloric wet etch to remove any oxides on the surface. In a specific embodiment, the metal stack is preferably not annealed or subjected to high temperature processing after its formation. In other embodiments, the metal stack may be annealed directly or indirectly via radiation, conduction, convection, or combinations thereof.

Figure 8:
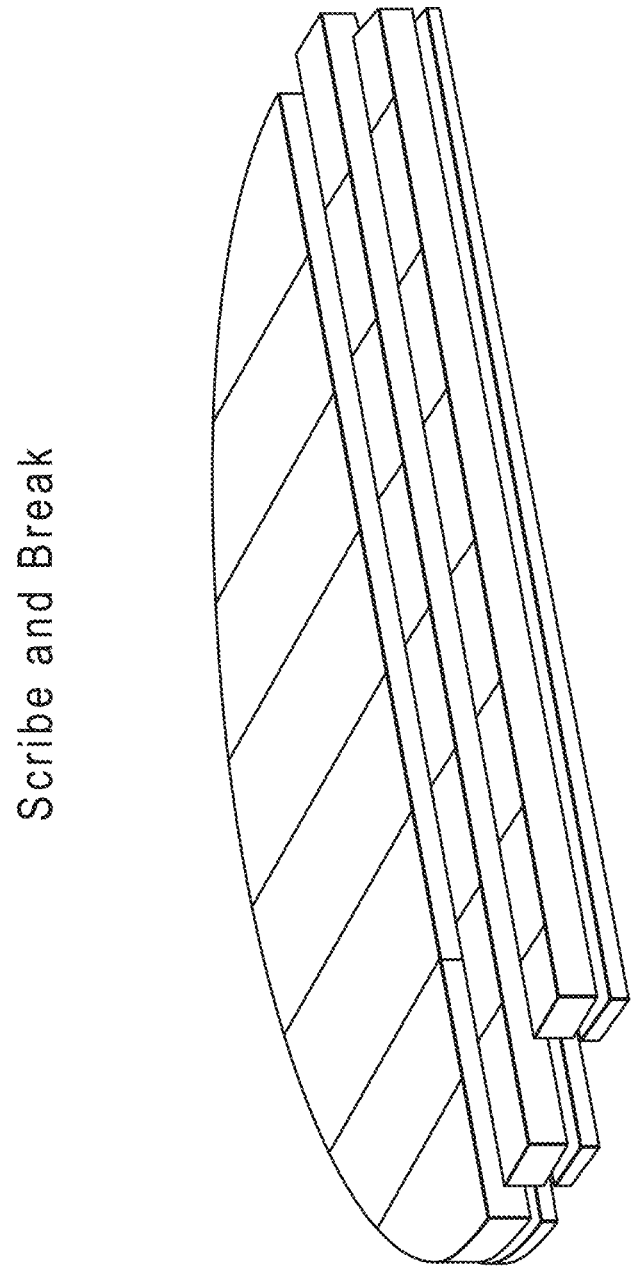

FIG. 8 is a simplified diagram illustrating a scribe and break operation according to one or more embodiments. This diagram is merely an illustration and should not unduly limit the scope of the claims herein. One of ordinary skill in the art would recognize other variations, modifications, and alternatives. After the n-contact is formed, the substrates are demounted from the sapphire carrier wafer and cleaned in acetone and isopropyl alcohol according to a specific embodiment. The substrates are then mounted onto vinyl tape for the scribe and break process depending upon the embodiment. In a preferred embodiment, the vinyl tape is non-tacky or other suitable configuration. In a preferred embodiment, the tape does not leave any residue on the laser bars, which are substantially free from such residues, which are often polymeric in nature or particulates. In other embodiments, there may be some residual material from the tape that is preferably removed.

In a specific embodiment, the present method performs a cleaning process to remove residual material from the substrate. After demounting the substrate from the tape, residue is often leftover from wax or other adhesive material from the tape. In a specific embodiment, the method removes the residue using at least a de-scum process. The de-scum process can include an oxygen plasma from an inductively coupled plasma using an oxygen species, e.g., O2. An example of such process uses an Oxford ICP 180, a vacuum pressure ranging in the millitorr range, such as 20 mT, a flow rate of oxygen from about 10 sccm to about 100 sccm, and preferably about 50 sccm of $O_2$ gas. The ICP uses RF power ranging from about 50 W to about 300 W ICP for a suitable amount of time and preferably about 10 minutes to remove the wax material. Other plasma processes such as reactive ion etching, barrel ashing, down stream ashing, and others may also be used.

Next, the method includes one or more scribing processes. In a specific embodiment, the method includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the scribing can be performed on the backside, frontside, or both depending upon the application.

In a specific embodiment, the method uses backside scribing or the like. With backside scribing, the method preferably forms a continuous line scribe that is perpendicular to the laser bars on the backside of the GaN substrate. In a specific embodiment, the scribe is generally 15-20 um deep or other suitable depth. Preferably, backside scribing can be advantageous. That is, the scribe process does not depend on the pitch of the laser bars or other like pattern. Accordingly, backside scribing can lead to a higher density of laser bars on each substrate according to a preferred embodiment. In a specific embodiment, backside scribing, however, may lead to residue from the tape on one or more of the facets. In a specific embodiment, backside scribe often requires that the substrates face down on the tape. With front-side scribing, the backside of the substrate is in contact with the tape. In one or more embodiments, front side scribing may be used for die separation.

In a specific embodiment, the present method performs a cleaning process to remove residual material from the substrate. After demounting the substrate from the tape, residue is often leftover from wax or other adhesive material from the tape. In a specific embodiment, the method removes the residue using at least a de-scum process. The de-scum process can include an oxygen plasma from an inductively coupled plasma using an oxygen species, e.g., O2. An example of such process uses an Oxford ICP 180, a vacuum pressure ranging in the millitorr range, such as 20 mT, a flow rate of oxygen from about 10 sccm to about 100 sccm, and preferably about 50 sccm of $O_2$ gas. The ICP uses RF power ranging from about 50 W to about 300 W ICP for a suitable time or preferably about 10 minutes to remove the wax material. Other plasma processes such as reactive ion etching, barrel ashing, down stream ashing, and others may also be used.

In a preferred embodiment, the present method uses frontside scribing, which facilitates formation of clean facets. In a specific embodiment, the frontside scribing process is preferably used. In a specific embodiment, the method includes a scribe pattern to produce straight cleaves with minimal facet roughness or other imperfections. Further details of scribing are provided below.

Scribe Pattern: The pitch of the laser mask can be about 200 um, but can be others. In the case of a 200 um pitch, the method uses a 170 um scribe with a 30 um dash. In a preferred embodiment, the scribe length is maximized or increased while maintaining the heat affected zone of the laser away from the laser ridge, which is sensitive to heat.

Scribe Profile: A saw tooth profile generally produces minimal facet roughness. It is believed that the saw tooth profile shape creates a very high stress concentration in the material, which causes the cleave to propogate much easier and/or more efficiently. In a specific embodiment, the profile may be a shallow scribe, which produces a recessed region. The shallow scribe ranges from about 3 to 10 microns and is preferably about 4 to 7 microns depending upon the specific embodiment.

In a specific embodiment, the present method uses an Opto Laser Scriber configured with a 355 nm laser or other suitable source. The laser outputs selected pulses to form a desirable scribe characterized with a skip. The scribe generally has a constant depth of ~5-10 um but can be others. The scriber also has a power of 100 mW to about 300 mW or other suitable power and has a beam moving at about 25 to about 100 mm/s, but can be slightly more or less, or other speeds. In a specific embodiment, the method also performs a slag removal process to remove the slag from the laser scribe using wet chemistry, e.g., 0.5-1.5:2.5-3.5 or 1:3, $HNO_3$:HCl, but can be others. The slag removal process improves the laser and its cleanliness in a preferred embodiment. In other embodiments, the method can use different laser configurations (e.g., different wavelength, different pulse frequency), a mechanical scribing process (e.g, diamond scribing), or deep etching using wet and/or dry techniques.

Figure 9:
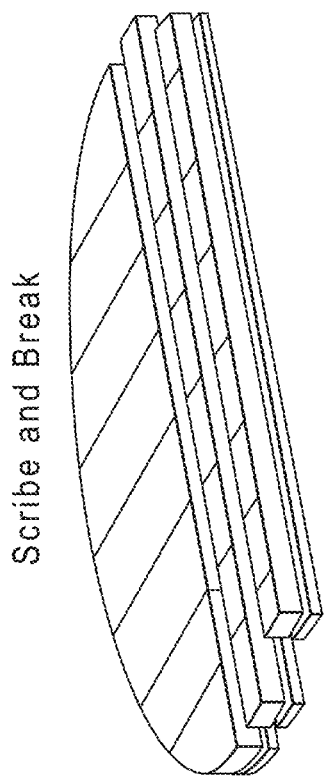
Figure 9:
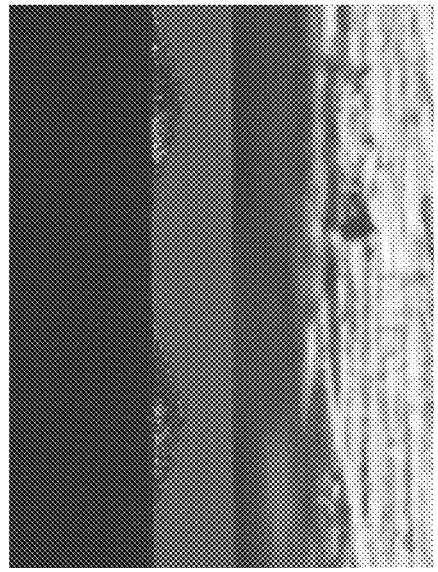
Figure 9:
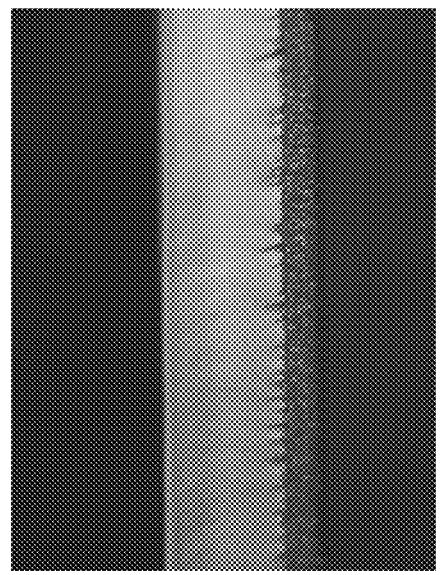

In a specific embodiment, the present method provides for a scribe suitable for fabrication of the present laser devices. As an example, FIG. 9 illustrates cross-sections of substrate materials associated with (1) a backside scribe process; and (2) a frontside scribe process.

Figure 10:
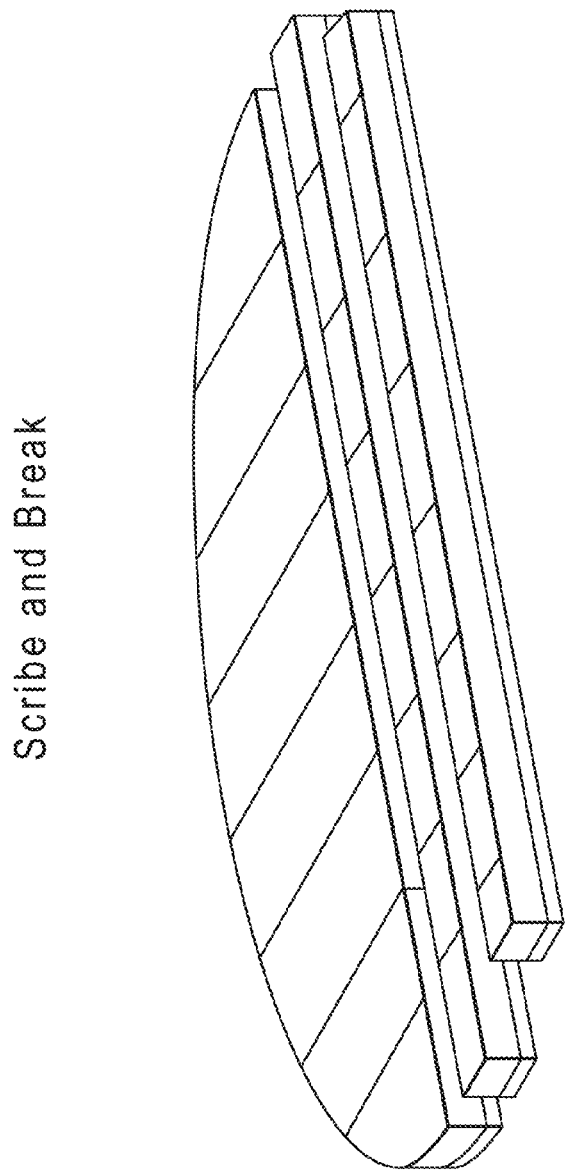

Referring now to FIG. 10, the method includes a breaking process to form a plurality of bar structures. This diagram is merely an illustration and should not unduly limit the scope of the claims herein. One of ordinary skill in the art would recognize other variations, modifications, and alternatives. After the GaN substrates are scribed, the method uses a breaker to cleave the substrates into bars. In a specific embodiment, the breaker has a metal support that has a gap spacing of 900 um for 600 micron long laser cavities. The substrate is positioned over the support so that the scribe line is in the centered. A suitably sharp ceramic blade, then applies pressure directly on the scribe line causing the substrate to cleave along the scribe line.

Figure 11:
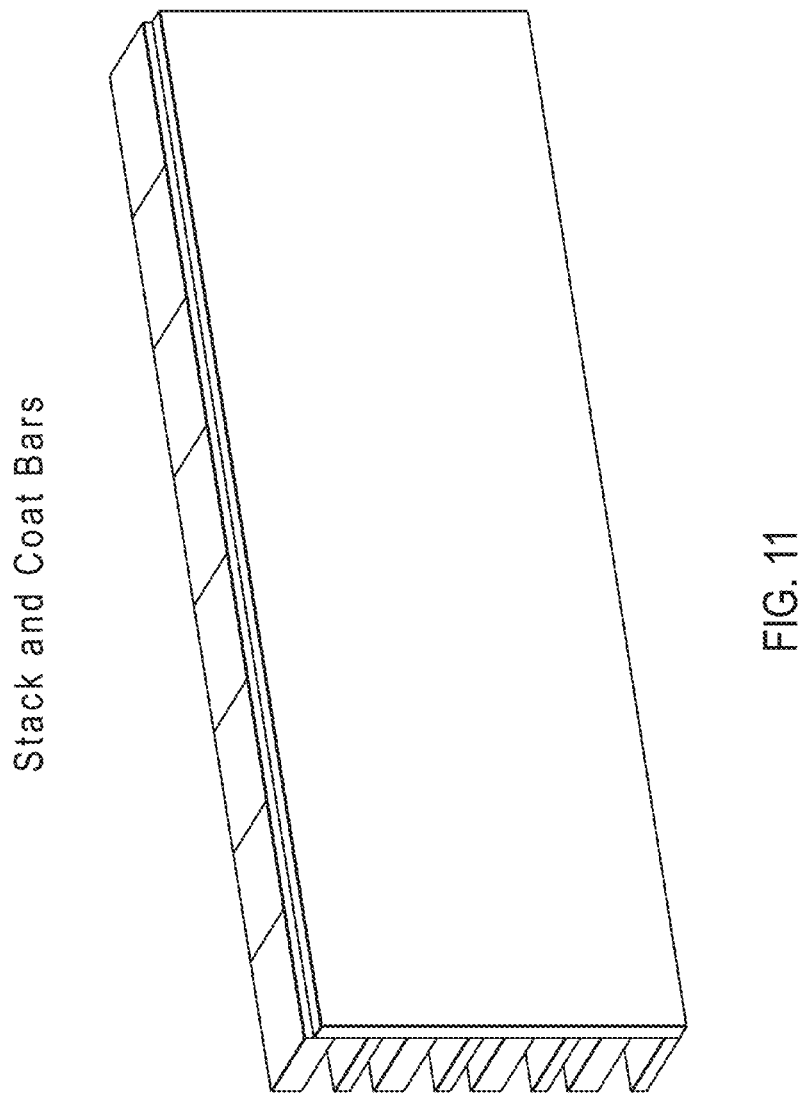

FIG. 11 is a simplified diagram illustrating a stacking and coating process according to one or more embodiments. Again, this diagram is merely an illustration and should not unduly limit the scope of the claims herein. One of ordinary skill in the art would recognize other variations, modifications, and alternatives. After cleaving, the bars are stacked in a fixture that allows for coating the front facet and back facet, which are in parallel alignment with each other and facing each other. The front facet coating films can be selected from any suitable low reflectance design (AR design). The AR design includes a quarterwave coating of $Al_2O_3$ capped with a thin layer of $HfO_2$ according to a specific embodiment. The $Al_2O_3$ coating is a robust dielectric, and $HfO_2$ is dense, which helps environmentally passivate and tune the reflectance of the front facet. These coating films are preferably deposited by e beam evaporation. Other examples include thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed cleaved surface prior to coating. In a specific embodiment, the back facet is coated with a high reflectance HR design. The HR design includes several quarterwave pairs of $SiO_2/HfO_2$. In a preferred embodiment, the HR design includes several quarterwave layer pairs of SiO2/Ta2O5 or other suitable materials. In a specific embodiment, roughly 6-7 pairs may be used to achieve a reflectance over 99%.

In a preferred embodiment, the method uses a suitable deposition system configured for deposition of each of the facets without breaking vacuum. The deposition system includes a dome structure with sufficient height and spatial volume. The system allows for the plurality of bars configured in a fixture to be flipped from one side to another side and to expose the back facet and the front facet according to a specific embodiment. In a preferred embodiment, the method allows for first deposition of the back facet, reconfiguring the bar fixture to expose the front facet, and second deposition of the front facet without breaking vacuum. In a preferred embodiment, the method allows for deposition of one or more films on front and back without breaking vacuum to save time and improve efficiency. Other embodiments can break vacuum.

Figure 12:
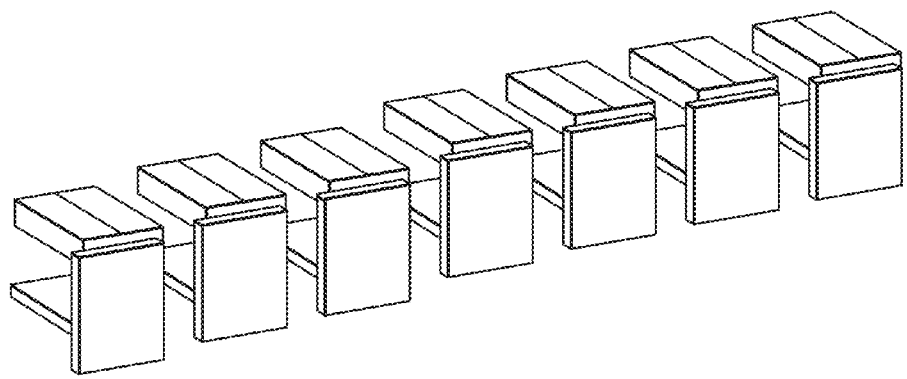

FIG. 12 illustrates a method directed to singulate bars into a plurality of die according to a specific embodiment. This diagram is merely an illustration and should not unduly limit the scope of the claims herein. One of ordinary skill in the art would recognize other variations, modifications, and alternatives. After the facets of the bars have been coated, the method includes testing the laser devices in bar form prior to die singulation. In a specific embodiment, the method singulates the bars by performing a scribe and break process (similar to the facet cleave). Preferably, the method forms a shallow continuous line scribe on the top side of the laser bar according to a specific embodiment. The width of each die is about 200 um, which may reduce the support gap to 300 um or so. After the bars have been cleaved into individual die, the tape is expanded and each of the die is picked off of the tape. Next, the method performs a packing operation for each of the die according to one or more embodiments.

EXAMPLES

Figure 13:
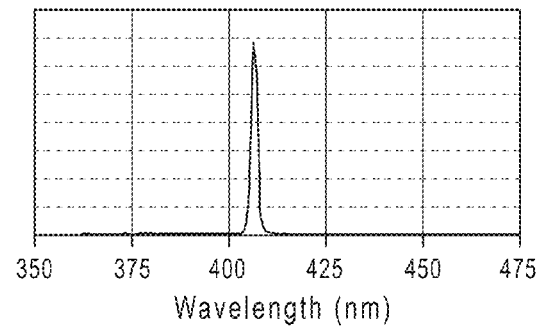
FIG. 13 is a simplified diagram illustrating a laser device according to one or more examples of the present invention.
Figure 13:
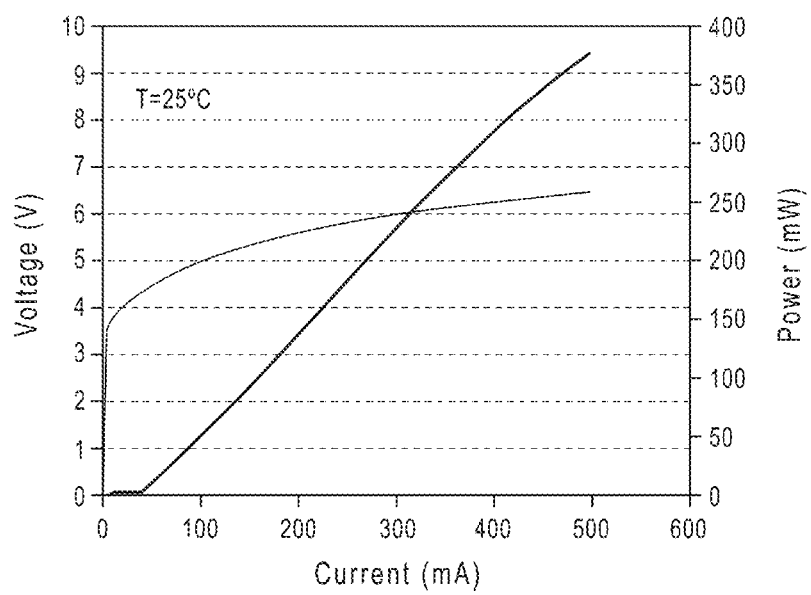

FIG. 13 is a simplified diagram illustrating a laser device according to one or more examples of the present invention. This diagram is merely an illustration and should not unduly limit the scope of the claims herein. One of ordinary skill in the art would recognize other variations, modifications, and alternatives. In this example, the optical device includes a gallium nitride substrate member having a nonpolar crystalline surface region characterized by an orientation of about +/−1 degree towards (0001) and less than about 0.3 degrees towards (11-20). The bulk GaN substrate has a surface dislocation density below 1E5 to 1E7 cm-2 or about 1E6 $cm^{-2}$ and a surface roughness of less than 0.2 nm.

The device has a laser stripe region formed overlying a portion of the nonpolar crystalline orientation surface region. The laser stripe region is characterized by a cavity orientation is substantially parallel to the c-direction and has a first end and a second end. The device has a first cleaved c-face facet provided on the first end of the laser stripe region and a second cleaved c-face facet provided on the second end of the laser stripe region. The first cleaved c-facet is substantially parallel with the second cleaved c-facet. Mirror surfaces are formed on each of the cleaved surfaces. The first cleaved c-facet comprises a first mirror surface. The first mirror surface is provided by a scribing and breaking process such as the one described herein. The first mirror surface comprises a reflective coating, which is alumina and hafnia. In a specific embodiment, the coating may include combinations of SiO2/Ta2O5, among other materials, and the like. The second cleaved c-facet comprises a second mirror surface. The second mirror surface is provided by a scribing and breaking process such as the one described herein. The second mirror surface comprises a reflective coating, such as silicon dioxide and hafnia. In a specific embodiment, the laser stripe has a length and width. The length is 400-1000 µm and the width is 1-1.4-4 µm. The width is substantially constant in dimension.

In a specific embodiment, the facets are configured in a desirable manner. That is, one of the facets is substantially free from coating and is generally exposed GaN material having a reflectance ~18.4% or more generally from about 10% to about 24%, but can be others. In a specific embodiment, the other facet is coated with a reflective material. In a specific embodiment, the reflective material may be λ/2 coatings of non-absorbing film materials to maintain the same or similar reflectance. Examples of materials include, among others, Al2O3, Ta2O5, SiO2, Ta2O5, ZrO2, TiO2, HfO2, NbO2, or others. In other embodiments, multilayer coatings using combinations of the above materials achieve the same reflectance. In still other embodiments, the coatings include single layer coatings with varying reflectances, multilayer coatings with varying reflectances, or others. In alternative embodiments, coatings may be deposited using similar or different processes and/or tools. As an example, such processes include e-beam evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed cleaved surface prior to coating.

As shown in the accompanying Figures, the device is also characterized by a spontaneously emitted light is polarized in substantially perpendicular to the c-direction. That is, the device performs as a laser. The spontaneously emitted light is characterized by a polarization ratio perpendicular to the c-direction. As also shown is the spontaneously emitted light characterized by a wavelength of about 405 nanometers to yield blue-violet emission. Other parameters included:

Wavelength: 395 to 415 nm
Power$_{CW}$>350 mW;
$I_{th}$<35 mA;
Slope efficiency>1.0 W/A; and
Packaged on TO-56 Header.

As shown, the graph illustrates a power and current relationship for the subject laser device at about 25 Degrees Celsius. Additionally, the wavelength is indicated at about 405 nanometers for the subject laser device. In a preferred embodiment, the present device uses thin barrier regions configured in the active region, which has been described throughout the present specification and more particularly below.

Figure 14:
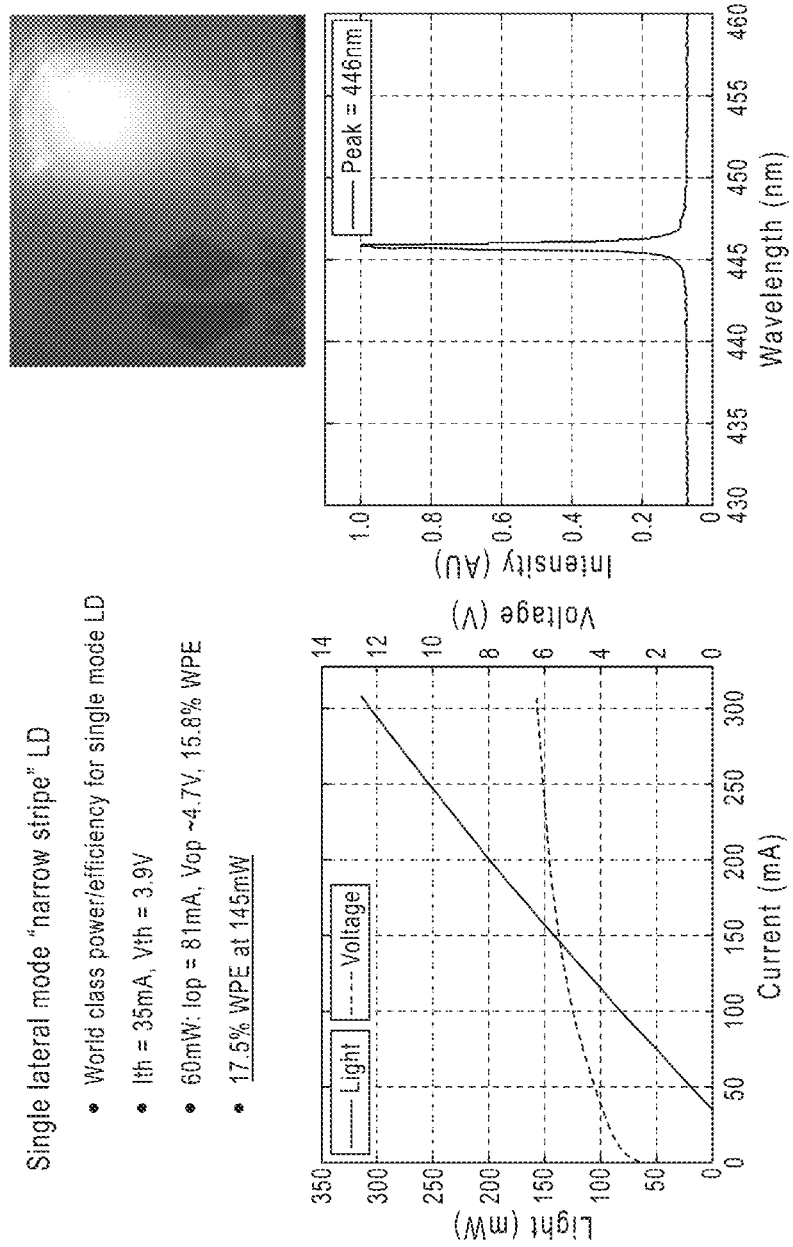
FIG. 14 is a simplified diagram illustrating performance of a 300 mW laser device according to an alternative example of the present invention.

FIG. 14 is a simplified diagram illustrating performance of a 300 mW single-lateral mode blue laser device operating at a wavelength of 446 nm according to an alternative example of the present invention. This diagram is merely an illustration and should not unduly limit the scope of the claims herein. One of ordinary skill in the art would recognize other variations, modifications, and alternatives. As shown are continuous wave (CW) optical output power plotted against input current and voltage along with a plot of optical intensity plotted against wavelength. The light power output plotted against input current and voltage provides an efficiency of 17.5% at 145 mW for the 300 mW CW blue laser device. The current and voltage thresholds are also shown. In a preferred embodiment, the present device uses thin barrier regions configured in the active region, which has been described throughout the present specification and more particularly below. The laser device is single mode and has been fabricated using the process and structures described herein.

Wavelength: 440 to 470 nm
Power$_{CW}$>300 mW;
I$_{th}$<40 mA;
Slope efficiency>1.0 W/A; and
Packaged on TO-56 or TO-38 Header.

Figure 15:
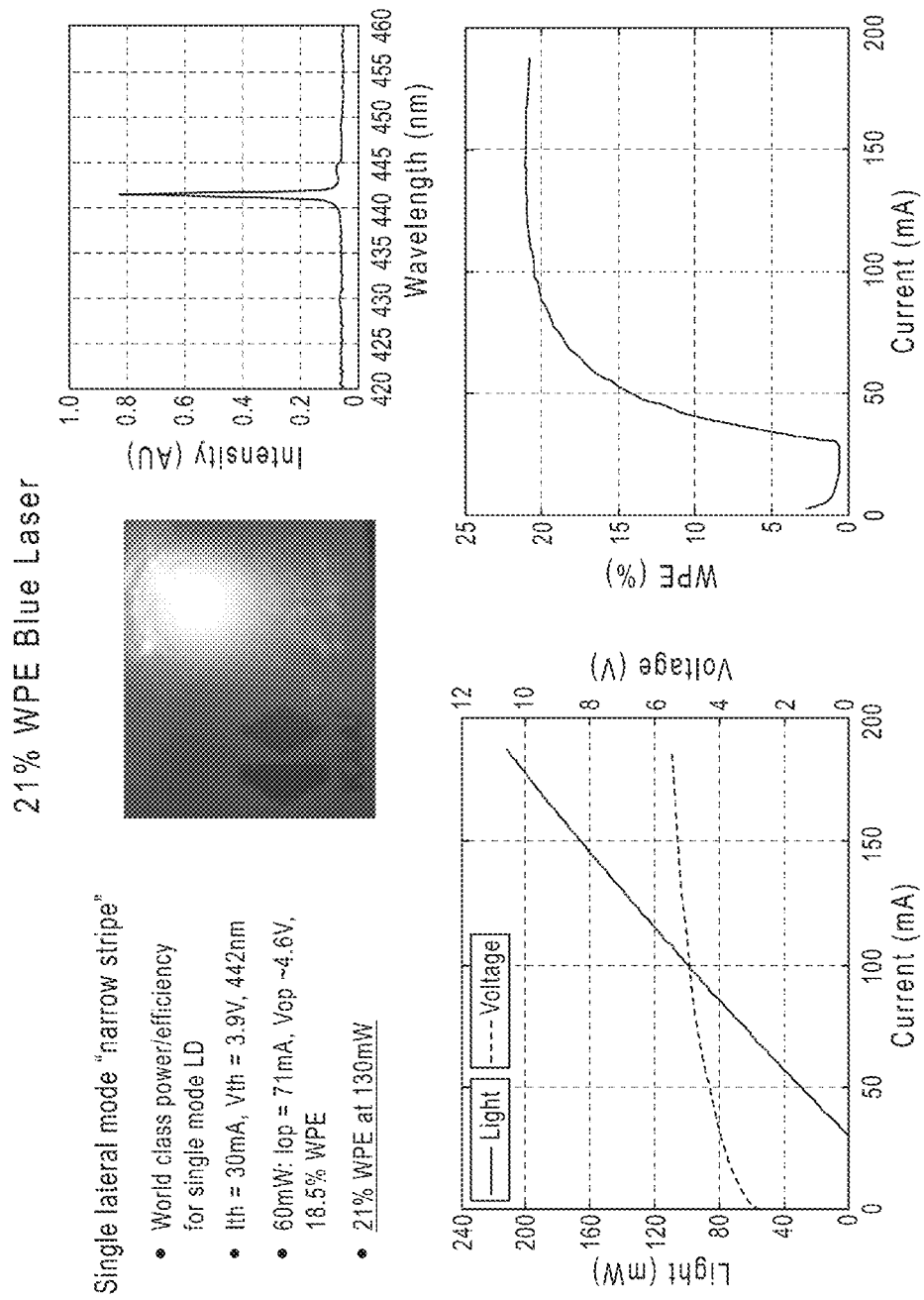
FIGS. 15 and 16 are simplified diagrams illustrating performance of a single-lateral mode blue laser devices with over 21% and 22% [peak] wall plug efficiency (WPE) operating at a wavelength of about 442 nm according to an alternative example of the present invention.
Figure 16:
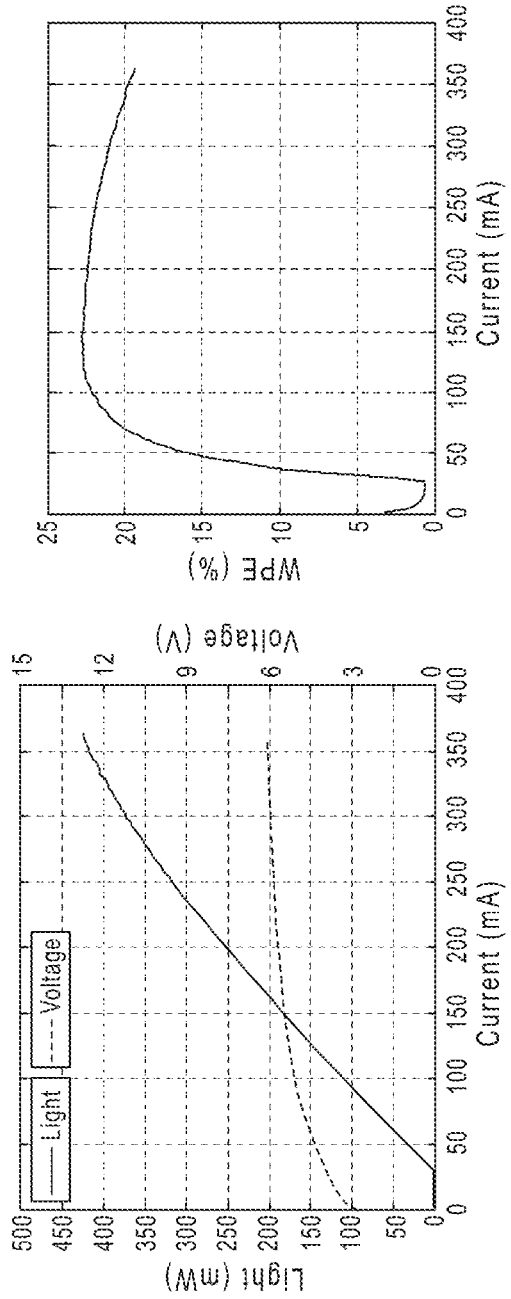

FIGS. 15 and 16 are simplified diagrams illustrating performance of a single-lateral mode blue laser devices with over 21% [peak] wall plug efficiency (WPE) operating at a wavelength of about 442 nm according to an alternative example of the present invention. These diagrams are merely an illustration and should not unduly limit the scope of the claims herein. One of ordinary skill in the art would recognize other variations, modifications, and alternatives. As shown in each of the Figures are continuous wave (CW) optical output power plotted against input current and voltage along with a plot of WPE versus input current with optical intensity plotted against wavelength in the inset. A maximum WPE is known as the peak WPE, although there may be other definitions. As seen in the plot of WPE versus current, the efficiency climbs over 20% at around 80 mA of input current, which translates to around 80 mW of output power. The single-lateral-mode blue laser device in FIG. 15 achieves a peak WPE of 21% at an output power of about 130 mW in a specific embodiment. The single-lateral-mode blue laser device in FIG. 14 achieves a peak WPE of 22.7% at an output power of about 170 mW according to a specific embodiment. Such WPE values from single lateral mode blue lasers represent state-of-the-art performance. The current and voltage thresholds are also shown. The laser device is single mode and has been fabricated using the process and structures described herein.

Figure 17:
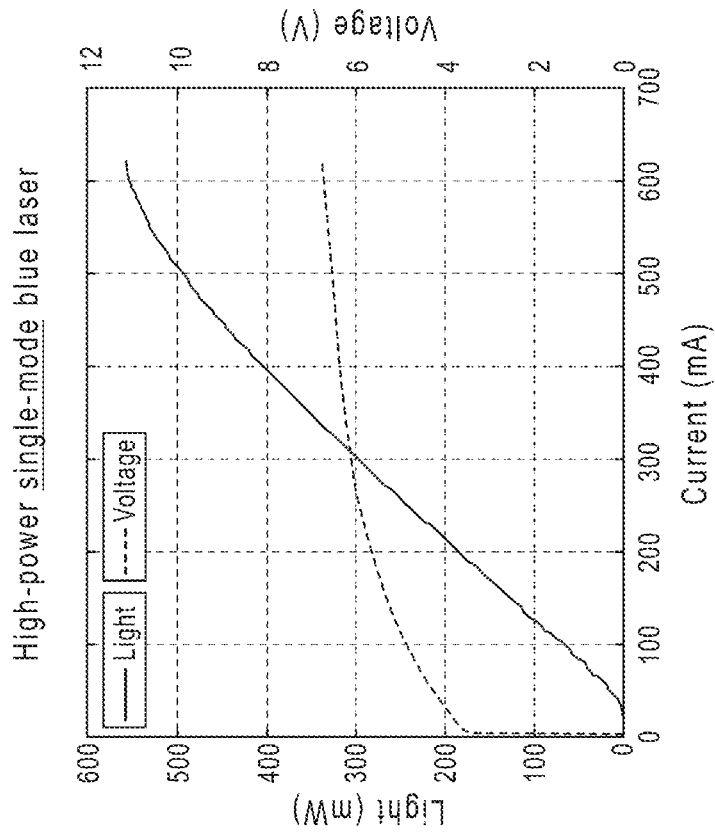
FIG. 17 is a simplified diagram illustrating performance of a 550 mW laser device according to an alternative example of the present invention.
Figure 17:
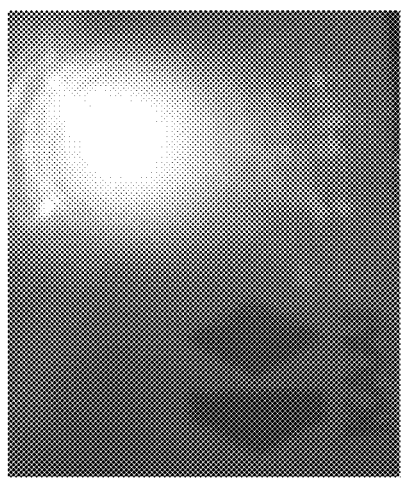

FIG. 17 is a simplified diagram illustrating performance of a CW 550 mW single lateral mode blue laser device according to an alternative example of the present invention. This diagram is merely an illustration and should not unduly limit the scope of the claims herein. One of ordinary skill in the art would recognize other variations, modifications, and alternatives. As shown are optical output power plotted against input current for a 550 mW CW laser device. The light power output plotted against current input provides an efficiency of 16.7% at 220 mW for the single lateral mode CW blue laser device. The device has a threshold current of 35 mA, a threshold voltage of 4.1 V, and outputs over 500 mW with about 500 mA of input current. Such output powers in the 500 mW range represents state-of-the-art performance from single lateral mode blue laser device. The laser has been fabricated using the process and structures described herein.

Figure 18:
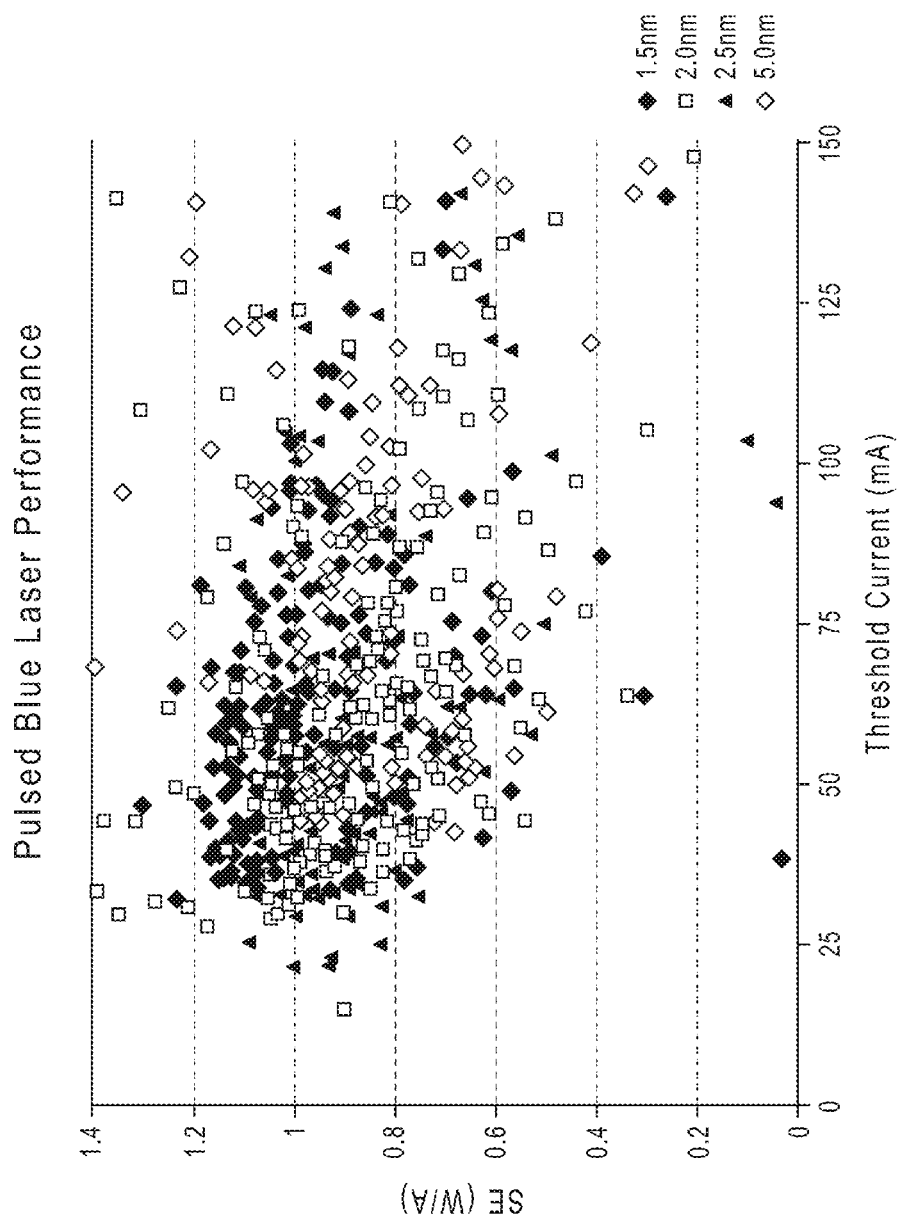
FIG. 18 is a detailed plot of pulsed slope efficiency versus threshold current for a plurality of blue lasers having different barrier thicknesses ranging from 1.5 nm to 5.0 nm to demonstrate that lasers characterized with barriers in the 1.5 to 2.5 nm range demonstrate lower threshold current and higher slope efficiency according to embodiments of the present invention.

Referring now to FIG. 18 in a specific embodiment, the present invention provides a laser device and related methods using thin barrier materials to achieve improved performance. As background, we learned that conventional laser diodes fabricated on c-plane GaN typically employ barrier thicknesses in the 6 nm to 12 nm and greater range. We have discovered that the performance of laser diodes fabricated on nonpolar and semipolar substrates can be improved by implementing ultra thin barriers according to the present embodiment, as further described by illustration in FIG. 18. For the present nonpolar blue laser with multi-quantum well (MQW) active regions comprised of 4-7 QWs with thicknesses in the 4 to 6 nm range, we have found that barrier thicknesses in the 1.5 nm to 2.5 nm range provide the lowest threshold current, highest slope efficiency, and lower forward voltage according to a preferred embodiment. Blue laser diodes employing such MQW active regions with 3 or more, or 5 or more QWs fabricated on conventional c-plane GaN would be impractical due to the high strain accumulation, which would likely lead to the onset of defects, as noted.

By reducing the barrier thickness to this ultra-thin 1.5 to 2.5 nm regime, the outer quantum wells within the active region are pushed in towards the peak of the optical mode, as also explained herein. This results in higher optical overlap of the electric field and the quantum wells within the laser. Since the modal gain of a laser is given by the product of the material gain and the optical confinement, this increase in the optical confinement results in increased modal gain. Increased gain reduces the threshold current density, and hence reduces the threshold current in a laser with a given cavity dimension.

Thin barriers can further increase the laser performance by again increasing the modal gain and by reducing absorption losses in the quantum wells by promoting a more uniform carrier distribution throughout the quantum wells according to a specific embodiment. The heavy effective mass of holes typically limits carrier transport in multi-quantum well InGaN-based devices. With a reduced total transport length from the p-side of the active region where holes are injected to the lower quantum wells towards the n-side, holes are more readily able to travel to the lowest quantum wells before recombining with an electron. Such thin barriers increase the probability for holes to tunnel through the barriers such that they do not need to overcome the potential energy of the hole/barrier hetereointerface. This again promotes more uniform carrier filling of the quantum wells. This more uniform carrier distribution profile assures that no wells are left unpumped such that they are absorbing or lossy to the optical mode. The higher loss associated with insufficiently pumped wells leads to an increased threshold current and a decreased slope efficiency. Further, the carrier uniformity prevents the case where a majority of the carriers are recombining in only some of the quantum wells such that the carrier concentration would become very high in those wells and the gain would saturate. A uniform carrier distribution guarantees that each quantum well is kept as far from gain saturation as possible for a given laser injection current.

A reduced transport length and a higher probability for carrier tunneling through the barriers could also reduce the forward voltage of the laser diode. Again, there can be other variations, modifications, and alternatives. As an alternative example for the present semipolar green laser operating in the 510 to 530 nm range, thin barriers can also be employed. In one embodiment for a green laser structure, 4 to 5 quantum wells with thicknesses that range from 3 nm to 4.5 nm and barriers that range in thickness from 2 nm to 4.5 nm can be employed.

In other embodiments, the present invention includes a device and method configured on other gallium and nitrogen containing substrate orientations. In a specific embodiment, the gallium and nitrogen containing substrate is configured on a family of planes including a {20-21} crystal orientation. In a specific embodiment, {20-21} is 14.9 degrees off of the m-plane towards the c-plane (0001). As an example, the miscut or off-cut angle is +/−17 degrees from the m-plane towards c-plane or alternatively at about the {20-21} crystal orientation plane. As another example, the present device includes a laser stripe oriented in a projection of the c-direction, which is perpendicular to the a-direction (or alternatively on the m-plane, it is configured in the c-direction). In one or more embodiments, the cleaved facet would be the gallium and nitrogen containing face (e.g., GaN face) that is +1-5 degrees from a direction orthogonal to the projection of the c-direction (or alternatively, for the m-plane laser, it is the c-face).

As shown, the present device can be enclosed in a suitable package. Such package can include those such as in TO-38 and TO-56 headers. Other suitable package designs and methods can also exist, such as TO-9 and even non-standard packaging. In a specific embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming an optical device comprising:
   providing a gallium and nitrogen containing member having an m-plane nonpolar crystalline surface region characterized by a laser stripe region overlying a portion of the m-plane nonpolar crystalline surface region, the laser stripe region being characterized by a cavity orientation substantially parallel to a c-direction, the laser stripe region having a first end and a second end;
   forming a pair of facets including a first c-face facet provided on the first end of the laser stripe region and a second c-face facet provided on the second end of the laser stripe region; and
   subjecting the first c-face facet to a deposition process.

2. The method of claim 1 wherein the deposition process includes coating the first c-face facet with a reflective material; and wherein forming the pair of facets comprises separately forming the first c-face facet and the second c-face facet.

3. The method of claim 1 wherein the pair of facets is formed before a singulating process; and wherein the m-plane nonpolar crystalline surface region is characterized by an off-cut orientation of about −1 degree towards (0001) and less than about 0.3 degrees towards (11-20).

4. The method of claim 1 wherein the optical device is configured as single lateral mode optical device or a multi-mode optical device.

5. The method of claim 1 wherein the optical device is characterized by a wall plug efficiency of 14% and greater.

6. The method of claim 1 wherein the optical device is characterized by a wall plug efficiency of 18% or 20% or 23% and greater.

7. The method of claim 1 further comprising maintaining the second c-face facet as substantially exposed gallium and nitrogen containing material.

8. The method of claim 1 wherein the first c-face facet and the second c-face facet are cleaved facets.

* * * * *